United States Patent [19]

Hourmand

[11] Patent Number: 5,796,183
[45] Date of Patent: Aug. 18, 1998

[54] CAPACITIVE RESPONSIVE ELECTRONIC SWITCHING CIRCUIT

[75] Inventor: Byron Hourmand, Hersey, Mich.

[73] Assignee: Nartron Corporation, Reed City, Mich.

[21] Appl. No.: 601,268

[22] Filed: Jan. 31, 1996

[51] Int. Cl.$^6$ .................................................. H01H 35/00
[52] U.S. Cl. ........................ 307/116; 361/181; 307/125; 307/139
[58] Field of Search ...................... 307/112, 113, 307/116, 125, 139, 140, 157; 361/181

[56] References Cited

U.S. PATENT DOCUMENTS

| | | |
|---|---|---|
| 3,549,909 | 12/1970 | Adelson et al. |
| 3,641,410 | 2/1972 | Vogelsberg |
| 3,651,391 | 3/1972 | Vogelsberg |
| 3,666,988 | 5/1972 | Bellis |
| 3,798,370 | 3/1974 | Hurst |
| 3,879,618 | 4/1975 | Larson ................ 307/116 |
| 3,899,713 | 8/1975 | Barkan et al. |
| 3,911,215 | 10/1975 | Hurst et al. |
| 3,919,596 | 11/1975 | Bellis |
| 3,965,465 | 6/1976 | Alexander |
| 3,984,757 | 10/1976 | Gott et al. |
| 4,016,453 | 4/1977 | Moennig |
| 4,031,408 | 6/1977 | Holz |
| 4,071,689 | 1/1978 | Talmage et al. |
| 4,101,805 | 7/1978 | Stone |
| 4,119,864 | 10/1978 | Petrizio |
| 4,152,629 | 5/1979 | Raupp |
| 4,159,473 | 6/1979 | Senk |
| 4,210,822 | 7/1980 | Wern |
| 4,211,959 | 7/1980 | Deavenport et al. |
| 4,213,061 | 7/1980 | Conner |
| 4,220,815 | 9/1980 | Gibson et al. |
| 4,237,421 | 12/1980 | Waldron |
| 4,246,533 | 1/1981 | Chiang |
| 4,257,117 | 3/1981 | Besson |
| 4,264,831 | 4/1981 | Wern |
| 4,289,972 | 9/1981 | Wern |
| 4,289,980 | 9/1981 | McLaughlin |
| 4,308,443 | 12/1981 | Tucker et al. |
| 4,323,829 | 4/1982 | Witney et al. |
| 4,352,141 | 9/1982 | Kent ................... 363/181 |
| 4,360,737 | 11/1982 | Leopold |
| 4,374,381 | 2/1983 | Ng et al. |
| 4,476,463 | 10/1984 | Ng et al. |
| 4,503,294 | 3/1985 | Matsumaru ............... 200/5 A |
| 4,731,548 | 3/1988 | Ingraham |
| 4,758,735 | 7/1988 | Ingraham |
| 4,831,279 | 5/1989 | Ingraham |
| 4,910,504 | 3/1990 | Eriksson |
| 4,939,382 | 7/1990 | Gruodis |
| 4,942,631 | 7/1990 | Rosa .................. 4/623 |
| 5,012,124 | 4/1991 | Hollaway |
| 5,066,898 | 11/1991 | Miller et al. |
| 5,087,825 | 2/1992 | Ingraham |
| 5,208,516 | 5/1993 | Saidian |
| 5,233,231 | 8/1993 | Wieth et al. |
| 5,235,217 | 8/1993 | Kirton ................... 307/326 |
| 5,386,219 | 1/1995 | Greanias et al. |
| 5,453,644 | 9/1995 | Yap et al. |
| 5,572,205 | 11/1996 | Caldwell et al. ............. 341/33 |

*Primary Examiner*—William M. Shoop, Jr.
*Assistant Examiner*—Jonathan Kaplan
*Attorney, Agent, or Firm*—Price, Heneveld, Cooper, DeWitt & Litton

[57] ABSTRACT

A capacitive responsive electronic switching circuit comprises an oscillator providing a periodic output signal having a frequency of 50 kHz or greater, an input touch terminal defining an area for an operator provide an input by proximity and touch, and a detector circuit coupled to the oscillator for receiving the periodic output signal from the oscillator, and coupled to the input touch terminal. The detector circuit being responsive to signals from the oscillator and the presence of an operator's body capacitance to ground coupled to the touch terminal when in proximity or touched by an operator to provide a control output signal. Preferably, the oscillator provides a periodic output signal having a frequency of 800 kHz or greater. An array of touch terminals may be provided in close proximity due to the reduction in crosstalk that may result from contaminants by utilizing an oscillator outputting a signal having a frequency of 50 kHz or greater.

32 Claims, 13 Drawing Sheets

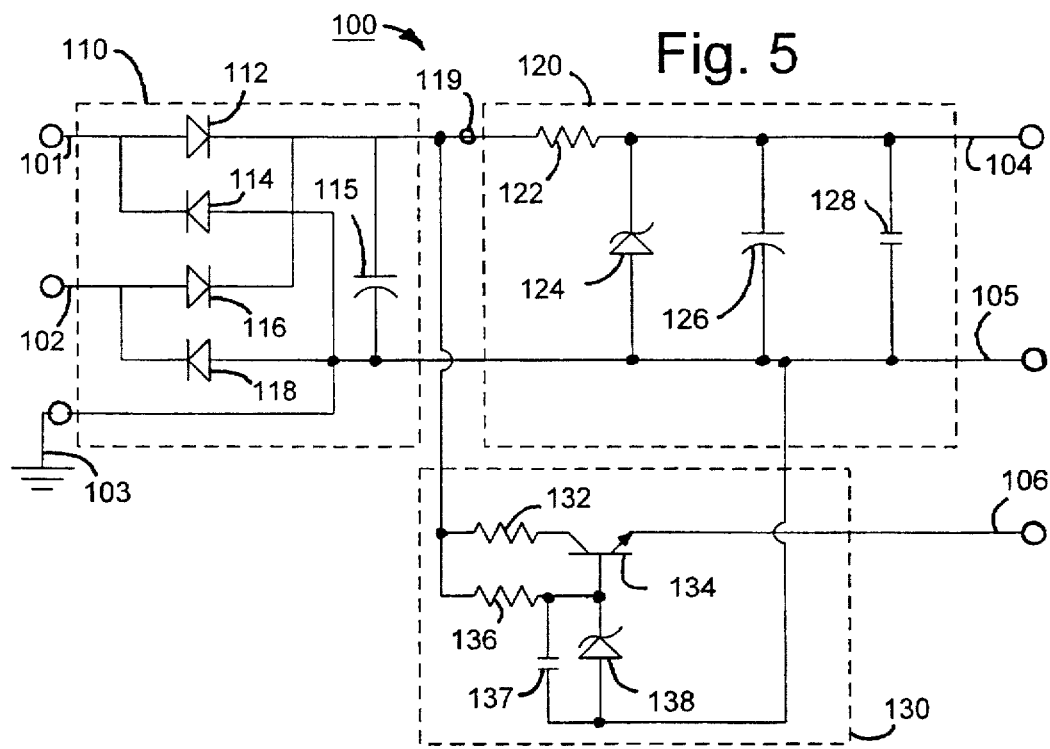
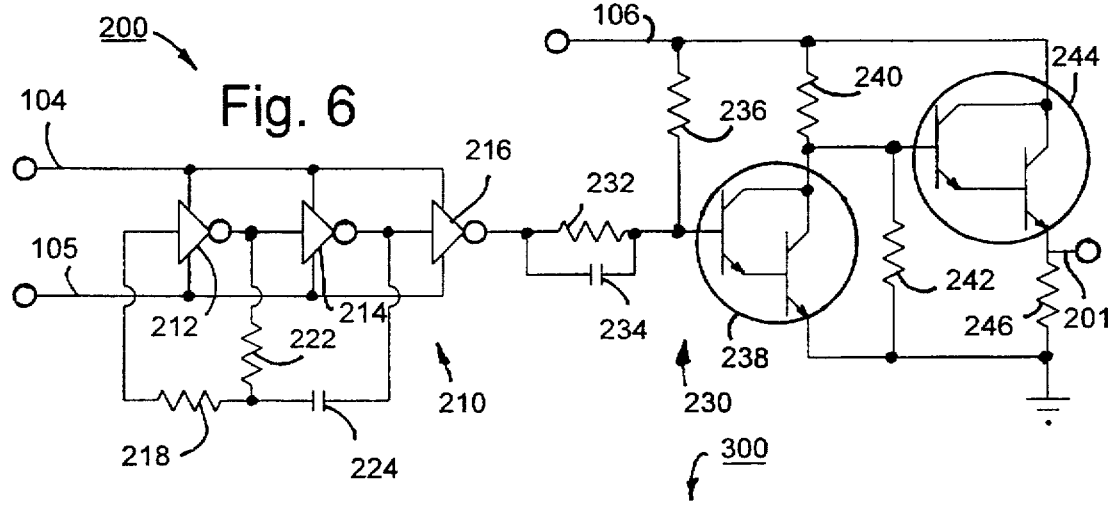
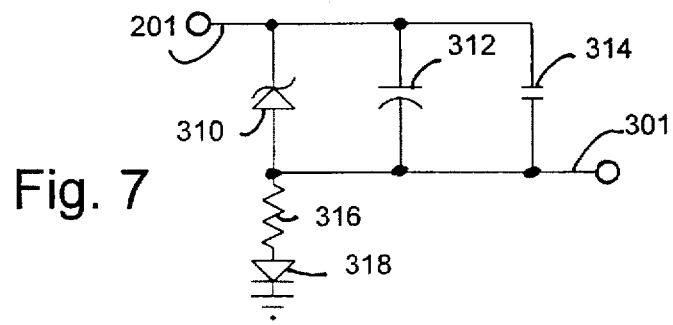

CAPACITIVE RESPONSIVE ELECTRONIC SWITCHING CIRCUIT

BACKGROUND OF THE INVENTION

The present invention relates to an electrical circuit and particularly a capacitive responsive electronic switching circuit used to make possible a "zero force" manual electronic switch.

Manual switches are well known in the art existing in the familiar forms of the common toggle light switch, pull cord switches, push button switches, and keyboard switches among others. The majority of such switches employ a mechanical contact that "makes" and "breaks" the circuit to be switched as the switch is moved to a closed or an open condition.

Switches that operate by a mechanical contact have a number of well known problems. First, mechanical movements of components within any mechanism make those components susceptible to wear, fatigue, and loosening. This is a progressive problem that occurs with use and leads to eventual failure when a sufficient amount of movement has occurred.

Second, a sudden "make" or "break" between conductive contacts typically produces an electrical arc as the contacts come into close proximity. This arcing action generates both radio frequency emissions and high frequency noise on the line that is switched.

Third, the separation between contacts that occurs on each break, exposes the contact surfaces to corrosion and contamination. A particular problem occurs when the arc associated with a "make" or "break" occurs in an oxidizing atmosphere. The heat of the arc in the presence of oxygen facilitates the formation of oxides on the contact surfaces. Once exposed, the contact surfaces of mechanical switches are also vulnerable to contaminants. Water borne contaminants such as oils and salts can be a particular problem on the contact surfaces of switches. A related problem occurs in that the repeated arcing of mechanical contact can result in a migration of contact materials away from the area of the mechanical contact. Corrosion, contamination, and migration operating independently or in combination often lead to eventual switch failure where the switch seizes in a closed or opened condition.

An additional problem results from the mechanical force required in operating a mechanical switch. This problem occurs in systems where a human operator is required to repetitively operate a given switch or a number of switches. Such repetitive motions commonly occur in the operation of electronic keyboards such as those used with computers and in industrial switches such as used in forming and assembly equipment among other applications. A common type of industrial switch is the palm button seen in pressing and insertion equipment. For safety purposes, the operator must press the switch before an insertion or pressing can occur. This ensures that the operators hand(s) is(are) on the button (s) and not in the field of motion of the associated machinery. It also ensures that the mechanical motion occurs at a desired and controllable point in time. The difficulty arises from the motion and force required of the operator. In recent years, it has been noted that repeated human motions can result in debilitating and painful wear on joints and soft tissues yielding arthritis like symptoms. Such repetitive motion may result in swelling and cramping in muscle tissues associated with conditions such as Carpal Tunnel Syndrome. Equipment designers combat these Repetitive Motion or Cumulative Trauma Disorders by adopting ergonomic designs that more favorably control the range, angle, number, and force of motions required of an operator as well as the number of the operator's muscle groups involved in the required motions. Prosthetics and tests are used as well to provide strain relief for the operator's muscles, joints, and tendons.

In mechanical switches, the force required to actuate the switch may be minimized by reducing spring forces and frictional forces between moving parts. However, reducing such forces makes such switches more vulnerable to failure. For instance, weaker springs typically lower the pressure between contacts in a "make" condition. This lower contact pressure increases the resistance in the switch which can lead to fatal heating in the switch and/or loss of voltage applied to the switched load. Reducing frictional forces in the switch by increasing the use of lubricants is undesirable because the lubricants can migrate and contaminate the contact surfaces. A switch designer may also reduce friction by providing looser fits between moving parts. However, looser fits tend to increase wear and contribute to earlier switch failure. A designer can also reduce friction by using higher quality, higher cost, surface finishes on the parts. Thus, as apparent from the foregoing description, measures taken to reduce actuator force in mechanical switch parts generally reduce the reliability and performance of the switch and/or increase the cost of the switch.

In applications such as computer keyboards or appliance controls, the electric load switched by a given switch can be quite low in terms of current and/or voltage. In such cases it is possible to use low force membrane switches such as described in U.S. Pat. No. 4,503,294. Such switches can relieve operator strain and are not as susceptible to arcing problems because they switch small loads. However, the flexible membrane remains susceptible to wear, corrosion, and contamination. Although such switches require very low actuation force, they are still mechanically based and thus suffer from the same problems as any other mechanical switch.

A more recent innovation is the development of "zero force" touch switches. These switches have no moving parts and no contact surfaces that directly switch loads. Rather, these switches operate by detecting the operator's touch and then use solid state electronics to switch the loads or activate mechanical relays or triacs to switch even larger loads. Approaches include optical proximity or motion detectors to detect the presence or motion of a body part such as in the automatic controls used in urinals in some public rest rooms or as disclosed in U.S. Pat. No. 4,942,631. Although these non-contact switches are by their very nature truly zero force, they are not practical where a multiplicity of switches are required in a small area such as a keyboard. Among other problems, these non-contact switches suffer from the comparatively high cost of electro-optics and from false detections when the operator's hand or other body part unintentionally comes close to the switch's area of detection. Some optical touch keyboards have been proposed, but none have enjoyed commercial success due to performance and/or cost considerations.

A further solution has been to detect the operator's touch via the electrical conductivity of the operator's skin. Such a system is described in U.S. Pat. No. 3,879,618. Problems with this system result from variations in the electrical conductivity of different operators due to variations in sweat, skin oils, or dryness, and from variable ambient conditions such as humidity. A further problem arises in that the touch surface of the switch that the operator touches must remain clean enough to provide an electrical conductivity path to the operator. Such surfaces can be susceptible to contamination, corrosion, and/or a wearing away of the conductive material. Also, these switches do not work if the operator is wearing a glove. Safety considerations also arise by virtue of the operators placing their body in electrical contact with the switch electronics. A further problem arises in that such systems are vulnerable to contact with materials that are equally or more conductive than human skin. For instance, water condensation can provide a conductive path as good as that of an operator's skin, resulting in a false activation.

A common solution used to achieve a zero force touch switch has been to make use of the capacitance of the human operator. Such switches, which are hereinafter referred to as capacitive touch switches, utilize one of at least three different methodologies. The first method involves detecting RF or other high frequency noise that a human operator can capacitively couple to a touch terminal when the operator makes contact such as is disclosed in U.S. Pat. No. 5,066,898. One common source of noise is 60 Hz noise radiated from commercial power lines. A drawback of this approach is that radiated electrical noise can vary in intensity from locale to locale and thereby cause variations in switch sensitivity. In some cases, devices implemented using this first method, rely on conductive contact between the operator and the touch terminal of the switch. As stated, such surfaces are subject to contamination, corrosion, and wear and will not work with gloved hands. An additional problem can arise in the presence of moisture when multiple switches are employed in a dense array such as a keyboard. In such instances, the operator may touch one touch terminal, but end up inadvertently activating others through the path of conduction caused by the moisture contamination.

A second method for implementing capacitive touch switches is to couple the capacitance of the operator into a variable oscillator circuit that outputs a signal having a frequency that varies with the capacitance seen at a touch terminal. An example of such a system is described in U.S. Pat. No. 5,235,217. Problems with such a system can arise where conductive contact with the operator is required and where the frequency change caused by a touch is close to the frequency changes that would result from unintentionally coming into contact with the touch terminal.

Another method for implementing capacitive touch switches relies on the change in capacitive coupling between a touch terminal and ground. Systems utilizing such a method are described in U.S. Pat. No. 4,758,735 and U.S. Pat. No. 5,087,825. With this methodology the detection circuit consists of an oscillator (or AC line voltage derivative) providing a signal to a touch terminal whose voltage is then monitored by a detector. The touch terminal is driven in electrical series with other components that function in part as a charge pump. The touch of an operator then provides a capacitive short to ground via the operator's own body capacitance that lowers the amplitude of oscillator voltage seen at the touch terminal. A major advantage of this methodology is that the operator need not come in conductive contact with the touch terminal but rather only in close proximity to it. A further advantage arises in that the system does not rely upon radiated emissions picked up by the operator's body which can vary with locale, but relies instead upon the human body's capacitance, which can vary over an acceptable range of 20 pF to 300 pF.

An additional consideration in using zero force switches resides in the difficulties that arise in trying to employ dense arrays of such switches. Touch switches that do not require physical contact with the operator but rather rely on the operator's close proximity can result in unintended actuations as an operator's hand or other body part passes in close proximity to the touch terminals. Above-mentioned U.S. Pat. No. 5,087,825 employs conductive guard rings around the conductive pad of each touch terminal in an effort to decouple adjacent touch pads and prevent multiple actuations where only a single one is desired. In conjunction with the guard rings, it is also possible to adjust the detection sensitivity by adjusting the threshold voltage to which the sensed voltage is compared. The sensitivity may be adjusted in this manner to a point where the operator's body part, for instance, a finger, has to entirely overlap a touch terminal and come into contact with its dielectric facing plate before actuation occurs. Although these methods (guard rings and sensitivity adjustment) have gone a considerable way in allowing touch switches to be spaced in comparatively close proximity, a susceptibility to surface contamination remains as a problem. Skin oils, water, and other contaminants can form conductive films that overlay and capacitively couple adjacent or multiple touch pads. An operator making contact with the film can then couple multiple touch pads to his or her body capacitance and it's capacitive coupling to ground. This can result in multiple actuations where only one is desired. Small touch terminals placed in close proximity by necessity require sensitive detection circuits that in some cases are preferably isolated from interference with the associated load switching circuits that they activate.

As mentioned, in industrial controls, switches can be used to control actuation time and to ensure that the operator's hand(s) or other body part(s) are out of the field of motion of associated machinery. A common type of switch used in this application is the palm button. The button is large enough so that the operator can rapidly bring his or her hand into contact with the button without having to lose the time that would be taken in acquiring and lining up a finger with a smaller switch. Zero force touch switches are also desirable in this application as Repetitive Motion or Cumulative Trauma Disorders have been a problem with operator's utilizing palm buttons—especially those palm buttons that must be actuated against a spring resistance. In this area capacitive touch switches have also been employed. U.S. Pat. No. 5,233,231 is an example of such an implementation. Due to the proximity of machinery with the potential to cause injury, false actuations are a particular liability in such applications. Capacitive touch switches that exhibit vulnerability to radiated electromagnetic noise or that operate off operator proximity have the potential to actuate when the operator's hand(s) is not at the desired location on the palm button(s). In general, this is addressed by the use of redundancies. In U.S. Pat. No. 5,233,231, a separate detector is used to measure RF noise and disable the system to a safe state if excessive RF noise is present. Other systems such as UltraTouch vended by Pinnacle Systems, Inc. use redundant sensing methodologies. In UltraTouch, both optical and capacitive sensors are used and actuation occurs only when both sensor types detect the operator's hand at the desired location. These implementations have a number of disadvantages. In the case of the RF noise detection system, the system is unusable in the presence of RF noise. This forces the user to employ a backup mechanical switch system or accept the loss of function when RF noise is present. The second system is less reliable and more expensive because it requires two sensor systems to accomplish the same task, i.e., detect the operator. Such system may also suffer from problems inherent in any optical system, namely, susceptibility to blockages in the optical path and the need to achieve and maintain specific optical alignments. A further problem is that this system considerably constrains the angle and direction of motion that the operator must use in activating the switch.

Currently, there are several zero force palm buttons in the market. These products utilize optical and/or capacitive coupling to activate a normally closed (NC) or a normally open (NO) relay, and thereby switching 110 V AC, 220 V AC, or 24 V DC to machine controllers. The UltraTouch by Pinnacle Systems Inc. uses two sensors (infrared & capacitive) with isolated circuits to activate a relay when a machine operator inserts his hand into a U-shaped sensor actuation tunnel. The company claims that by permitting the machine operator to activate the machine with no force or pressure and with the operator's hand and wrist in the ergonomic neutral position (i.e. 0° wrist joint angle and 100% hand power positions as shown in FIG. 1.0-1), hand, wrist, and arm stresses are minimized and contributing elements to Carpal Tunnel Syndrome are negated. After a machine cycle is initiated, the operator must maintain an initial posture until the cycle is completed. A typical cycle time lasts approximately one to two seconds and is repeated about 3000 times daily. This adds up to about one hour to one hour and a half per day while the operator is in the posture. While this module reduces stress on wrist and hand, it strains the muscles in the forearm. Also, because of limited space permitted for the operator to insert his hand, it stresses the operator mentally and reduces productivity by causing fatigue. Furthermore, the infrared emitters and detectors rely on a clean path between the transmitter and receiver and will not operate properly if contaminants block the beam of light.

SUMMARY OF THE INVENTION

The present invention overcomes the above problems by using the method of sensing body capacitance to ground in conjunction with redundant detection circuits. Additional improvements are offered in the construction of the touch terminal (palm button) itself and in the regime of body capacitance to ground detection which minimizes sensitivity to skin oils and other contaminants. The invention also allows the operator to utilize the system with or without gloves which is a particular advantage in the industrial setting.

The specific touch detection method of the present invention has similarities to the devices of U.S. Pat. No. 4,758,735 and U.S. Pat. No. 5,087,825. However, significant improvements are offered in the means of detection and in the development of an overall system to employ the touch switches in a dense array and in an improved zero force palm button. The touch detection circuit of the present invention features operation at frequencies at or above 50 kHz and preferably at or above 800 kHz to minimize the effects of surface contamination from materials such a skin oils and water. It also offers improvements in detection sensitivity that allow close control of the degree of proximity (ideally very close proximity) that is required for actuation and to enable employment of a multiplicity of small sized touch terminals in a physically close array such as a keyboard. The circuitry of the present invention minimizes the force required in human operator motions and eliminates awkward angles and other constraints required in those motions. The outer surface of the touch switch typically consists of a continuous dielectric layer such as glass or polycarbonate with no mechanical or electrical feed-throughs. The surface can be shaped to have no recesses that would trap or hold organic material. As a result it is easily cleaned and kept clean and so is ideal for hygienic applications such as medical or food processing equipment.

In a first preferred embodiment the circuit offers enhanced detection sensitivity to allow reliable operation with small (finger size) touch pads. Susceptibility to variations in supply voltage and noise are minimized by use of a floating common and supply that follow the oscillator signal to power the detection circuit. The enhanced sensitivity allows the use of a 26V or lower amplitude oscillator signal applied to the touch terminal and detection circuit. This lower voltage (as compared to the device of U.S. Pat. No. 4,758,735) obviates the need for expensive UL listed higher voltage construction measures and testing to handle what would otherwise be large enough voltages to cause safety concerns. A further advantage of the present invention is seen in the manner in which the touch terminal detection circuit is interfaced to the touch terminals and to external control systems. A dedicated microprocessor referenced to the floating supply and floating common of the detection circuit maybe used to cost effectively multiplex a number of touch terminal detection circuits and multiplex the associated touch terminal output signals over a two line optical bus to a dedicated microprocessor referenced to a fixed supply and ground. An additional advantage of the microprocessor is an expanded ability to detect faults, i.e. a pad that is touched for an excessive amount of time that is known a priori to be an unlikely mode of operation or two or more pads touched at the same time or in an improper order. Additionally, the microprocessor can be used to distinguish desired multiple pad touches in simultaneous or sequential modes, i.e. two or more switches touched in a given order within a given amount of time. The microprocessor can be used to perform system diagnostics as well. The microprocessor also allows the use of visual indicators such as LEDs or annunciators such as a bell or tone generator to confirm the actuation of a given touch switch or switches. This is particularly useful in cases where a sequence of actuations is required before an action occurs. The feedback to the operator provided by a visual or audio indicator activated by the microprocessor in response to intermediate touches in a required sequence can minimize time lost and/or frustration on the part of the operator due to failed actuations from partial touches or wrong actuations from touching the wrong pad in a given required sequence or combination of touches. The second microprocessor may be used to communicate with the user's control system. Additional features include a "sleep mode" to minimize power consumption during periods of non-use or power brown outs, and redundant control circuits to facilitate "fail to safe" operation. Another improvement is offered in a means to move much of the cost of the system into simplified custom integrated circuits that allow ease of sensitivity adjustment and assembly.

In a second preferred embodiment, an improved palm button is featured. Through the use of a dielectric cover, a large metallic touch terminal can be used that differentiates between the touch of a finger or partial touch and the full touch of a palm. In this way the system avoids false triggers due to inadvertent finger touches or brushing contact with the palm prior or after an intended touch. The second embodiment also features redundant control circuits to facilitate "fail to safe" operation.

To achieve these and other advantages, and in accordance with the purpose of the invention as embodied and described herein, the capacitive responsive electronic switching circuit comprises an oscillator providing a periodic output signal having a frequency of 50 kHz or greater, an input touch terminal defining an area for an operator to provide an input by touch, and a detector circuit coupled to the oscillator for receiving the periodic output signal from the oscillator, and coupled to the input touch terminal. The detector circuit being responsive to signals from the oscillator and the presence of an operator's body capacitance to ground coupled to the touch terminal when touched by an operator to provide a control output signal. Preferably, the oscillator provides a periodic output signal having a frequency of 800 kHz or greater.

These and other features, objects, and advantages of the invention may be realized and obtained by means of the instrumentalities and combinations particularly pointed out in the written description and claims hereof, as well as by the appended drawings.

BRIEF DESCRIPTION OF THE DRAWINGS

FIG. 5 is an electrical schematic of a preferred voltage regulator circuit for use in the capacitive responsive electronic switching circuit shown in FIG. 4;

FIG. 6 is an electrical schematic of a preferred oscillator circuit for use in the capacitive responsive electronic switching circuit shown in FIG. 4;

FIG. 7 is an electrical schematic of a preferred floating common generator circuit for use in the capacitive responsive electronic switching circuit shown in FIG. 4;

DETAILED DESCRIPTION OF THE PREFERRED EMBODIMENTS

As apparent from the above summary, the touch circuit of present invention operates at a higher frequency than prior touch sensing circuits. A move to high frequency operation (>50 to 800 kHz) is not a benign choice relative to the lower frequency (60 to 1000 Hz) operation seen in existing art such as U.S. Pat. No. 4,758,735 and U.S. Pat. No. 5,087,825. Higher frequencies require generally more costly, higher speed parts, and often results in the added cost of special design measures to minimize electronic emissions and the introduction of high frequency noise on power supply lines. The preference for using such higher frequencies is based on a study performed to determine if high frequency operation would allow a touch of an operator and conduction via surface contamination films, such as moisture, providing a conductive path from a non-touched area to the touched area. The study also determined whether a high frequency touch circuit could operate over a sufficiently wide temperature range, an assortment of overlying dielectric layer thicknesses and materials, and in the presence of likely power supply fluctuations. The following calculations and measurements are the results of this study. The results summarize the investigation conducted to reduce crosstalk due to condensation of water on the dielectric member (glass). By increasing the frequency of operation, the impedance of the body-glass combination is reduced as compared to the impedance of water between the touch pads.

Figure 1:
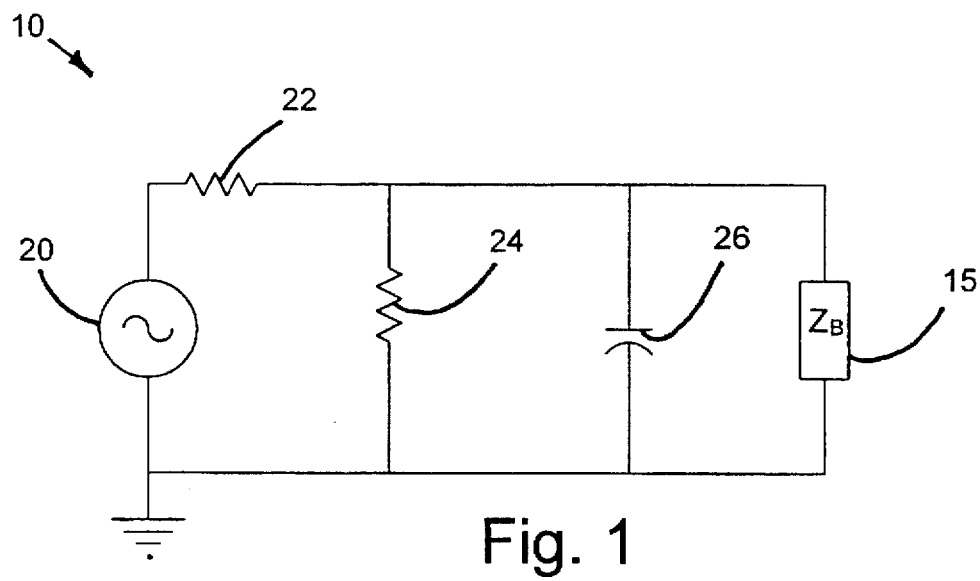
FIG. 1 is an electrical schematic of a testing circuit used to measure the impedance of the human body.

The equivalent circuit of body impedance was measured using the testing circuit 10 shown in FIG. 1. Testing circuit 10 includes an oscillator 20 coupled between ground plate and a 100 k$\Omega$ series resistor 22 and in parallel with a 10 M$\Omega$ resistor 24, a 20 pF capacitor 26, and contacts for connecting to a human body identified in the figure as an impedance load 15 having an impedance $Z_B$ representing the body's impedance.

Two types of measurements were taken: one with the person under test standing on a large ground plane i.e., concrete slab; and another while standing on a subfloor. The subfloor was used to simulate a typical northern home, i.e., wood joists with plywood sheeting. Carpeting was used as an added insulation layer. Table 1 below shows the measured body resistance and capacitance for five individuals.

TABLE 1

| CONCRETE SLAB | CONCRETE SLAB | SUBFLOOR | SUBFLOOR |
| --- | --- | --- | --- |
| 1.4 k$\Omega$ | 100 pF | 1.7 k$\Omega$ | 73 pF |
| 1.4 k$\Omega$ | 217 pF | 1.9 k$\Omega$ | 78 pF |
| 1.3 k$\Omega$ | 174 pF | 1.9 k$\Omega$ | 93 pF |
| 1.2 k$\Omega$ | 160 pF | 1.6 k$\Omega$ | 85 pF |
| 1.0 k$\Omega$ | 107 pF | 1.4 k$\Omega$ | 75 pF |

As apparent from Table 1 above and the discussion to follow, a human body's impedance may be represented by the series combination of a 20–300 pF capacitor and a 1 k–2 k$\Omega$ resistor.

Figure 2:
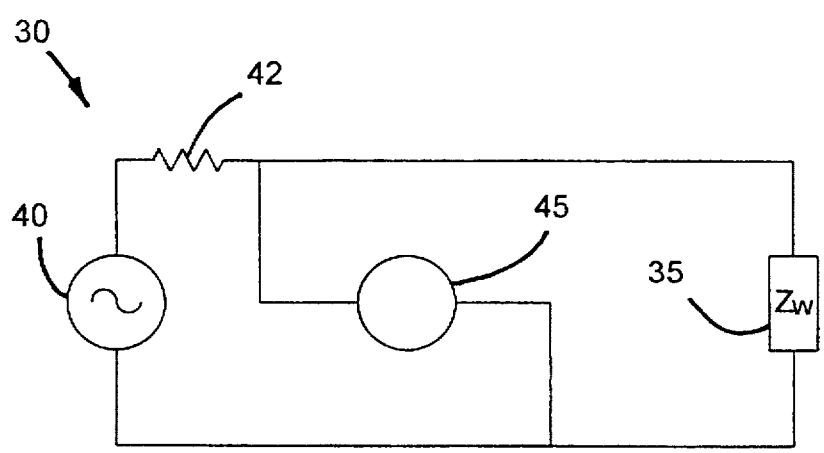
FIG. 2 is an electrical schematic of a testing circuit used to measure the impedance of water.

The impedance of water, which is mainly resistive, was measured using the testing circuit 30 shown in FIG. 2. Testing circuit 30 includes an oscillator 40 coupled in series with a 1 M$\Omega$ resistor 42 and contacts across which water is applied to define an impedance load 35 having an impedance $Z_w$ representing the impedance of water. A true RMS voltage meter 45 is connected across the contacts of the impedance load 35.

The resistance of tap water over a 1×1 inch area and 1/32 inch deep, was measured to be around 160 kΩ.

The following calculation is for resistance of rain water where c is the conductivity for rain:

$$R = \left(\frac{1}{cin}\right) \times \left(\frac{L}{A}\right) \quad \text{Eq. 1}$$

where, $$c = 128 \times 10^{-6}(\Omega - cm)^{-1}$$

$$cin = c\left(\frac{100\,cm}{m}\right)\left(\frac{.0254\,m}{in}\right)$$

$$L = 1.0\,in$$

$$A = (1.0) \times \left(\frac{1}{32}\right) = \frac{1}{32}\,in^2$$

therefore, $$R = \left(\frac{1}{325.12 \times 10^{-6}}\right) \times \left(\frac{1.0\,in}{\frac{1}{32}\,in^2}\right) = 98.43\,k\Omega$$

However, the thickness of a layer of water condensed on the surface of glass is much less than 1/32 inch and it's resistance is higher than that of tap water. For design purposes, a resistance value of 1 MΩ was used to simulate water.

The capacitance of a piece of glass measuring ½"×½"× ¼", is approximately 2 pF.

where, $$C = K_{glass}K_o\frac{A(cm^2)}{L(cm)} \quad (\mu F) \quad \text{Eq. 2}$$

$K_o = 0.08842 \times 10^{-6}$ for vacuum $6.0 < K_{glass} < 10$ $A = 0.25\,in^2$ $L = 0.25\,in$ therefore, $C_{max} = 10 \times 0.08842 \times 10^{-6} \times 2.54 \times 10^{-6} = 2.25\,pF$ $C_{min} = 6 \times 0.08842 \times 10^{-6} \times 2.54 \times 10^{-6} = 1.35\,pF$ Table 2 below shows the dielectric constant for several types of glass:

TABLE 2

| TYPE OF GLASS | Dielectric Constant (K) |
|---|---|
| Corning 0010 | 6.32 |
| Corning 0080 | 6.75 |
| Corning 0120 | 6.65 |
| Corning 8870 | 9.5 |

Figure 3:
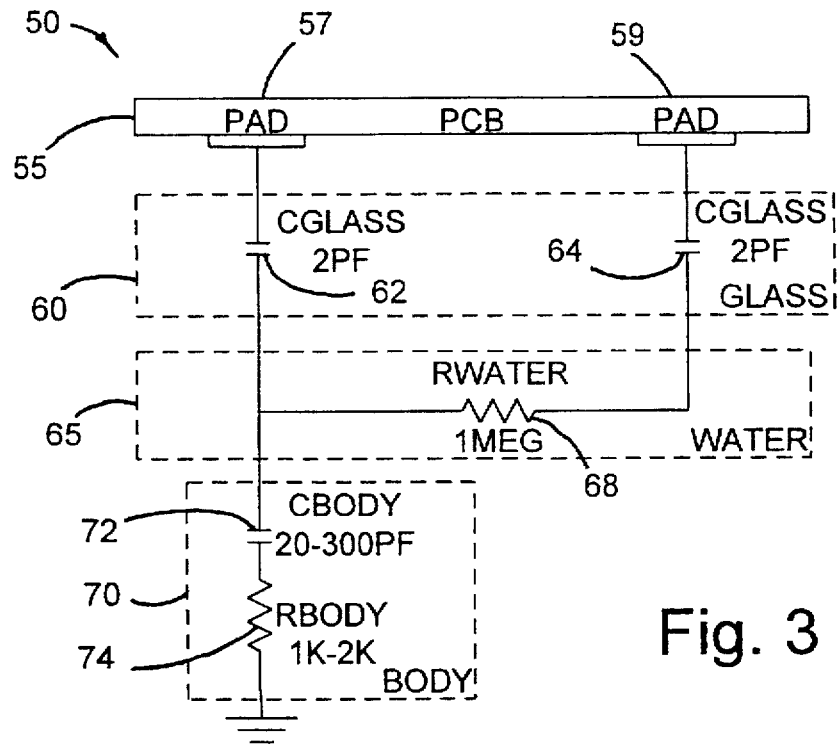
FIG. 3 is an electrical schematic of an equivalent circuit model for analyzing a human body in contact with glass covered with water.

The equivalent circuit 50 of body touching the glass with the presence of water is shown in FIG. 3. As shown, the equivalent circuit 50 includes a polycarbon (PCB) plate 55 having at least two pads 57 and 59 formed thereon, a glass plate 60 adjacent to PCB plate 55, water 65 on glass plate 60 spanning at least two touch pad areas, and a body 70 in contact with the water 65 and glass plate 60 at one touch pad area. The impedance of glass plate 60 is approximated by two 2 pF capacitors 62 and 64 connected to pads 57 and 59, respectively. The water 65 is approximated by a 1 MΩ resistor 68 connected between capacitors 62 and 64. The body is represented by a 20–300 pF capacitor 72 coupled at one end to water resistor 68 and glass plate capacitor 62, and by a 1–2 kΩ resistor 74 coupled between the other end of capacitor 72 and ground.

Referring to FIG. 3, it can be seen that a human touch opposite pad 57 will couple pad 57 to ground through the capacitance of glass 62 and the series contact with the human body impedance provided by the 20–300 pF capacitance and the 1 k-2 kΩ resistance of a typical human body. This will have the effect of pulling any voltage on the pad towards ground. Pad 59 will be similarly effected, however it's coupling to ground will not only be through capacitance 64, and the series capacitance and resistance of the human body, but will also be through the ohmic resistance of water on the glass cover between the proximate location of pad 59 and the touched pad 57. Because the human capacitance is considerably greater than the 2 pF capacitance of the glass, the impedance of the path to ground for pads 57 and 59 will be dominated by the glass and water impedances. If the impedance of the water path is significant compared to that of the glass, then the effect of a touch will be more significant at pad 57 than at pad 59. To overcome the effect of condensation or possible water spills, the impedance of the glass is preferably made as small as is practical compared to the impedance of the water. This allows discrimination between touched and adjacent pads. As the water impedance is primarily resistive and the glass impedance is primarily capacitive, the impedance of the glass will drop with frequency.

Figure 3A:
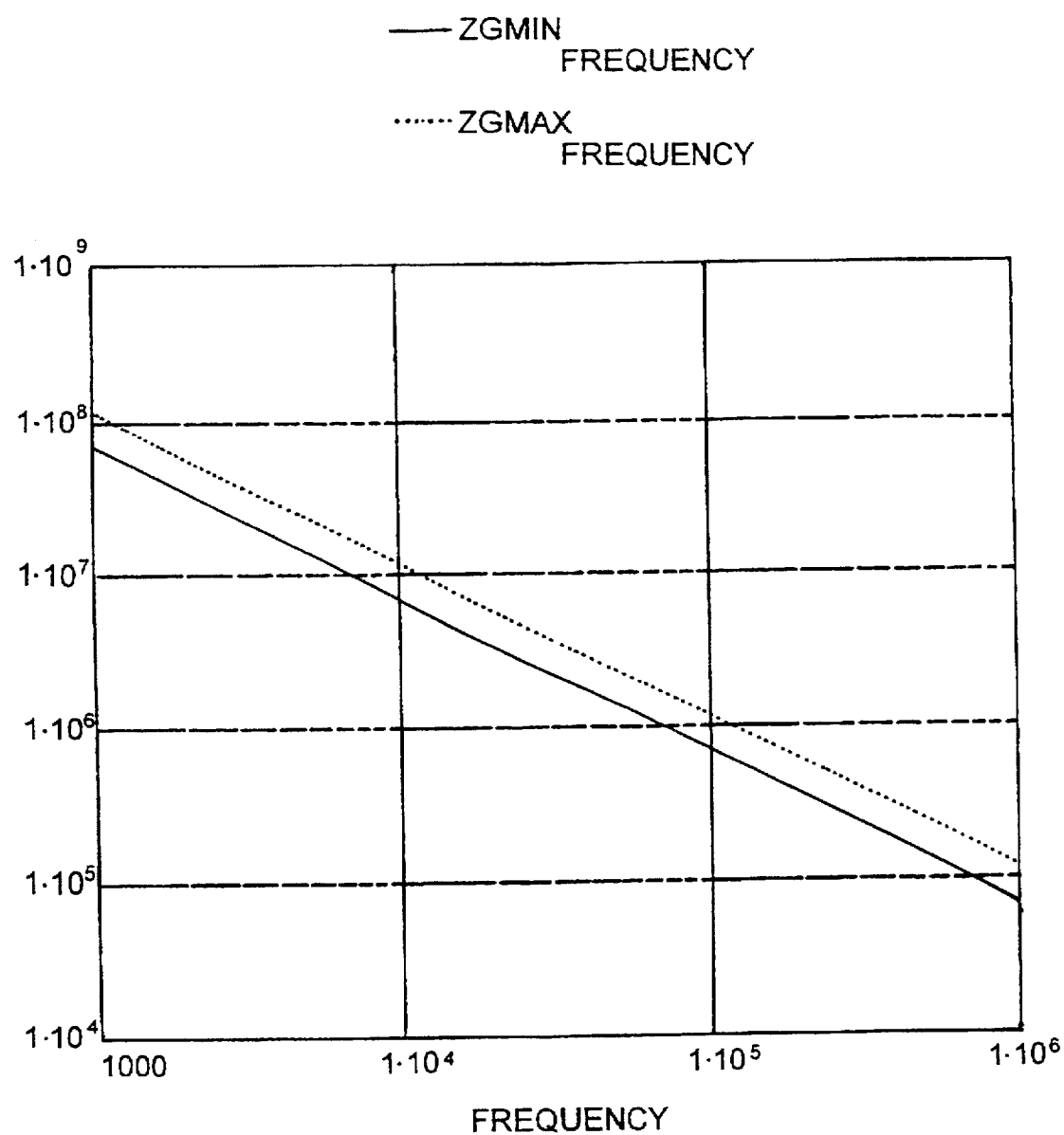

FIG. 3A shows the maximum and minimum glass impedance as a function of frequency. The maximum and minimum glass impedances shown were computed as follows:

$e_o = 8.854 \times 10^{-12} C^2/(nm^2)$ $K_{gmin} = 6$ $K_{gmax} = 10$ $A = 0.25\,in^2$ $L = 0.25\,in$ $C_{max} = K_{gmax}e_oA/L\ C_{max} = 2.249\,pF$ $C_{min} = K_{gmin}e_oA/L\ C_{min} = 1.349\,pF$ $Zgmin_{frequency} = 1/(2\,\pi C_{max}\text{frequency})$ $Zgmax_{frequency} = 1/(2\,\pi C_{min}\text{frequency})$ As can be seen, at 1 kHz, the capacitive impedance of the glass is much greater than the nominal 1 MΩ of the water bridge between the pads. As a result, at 1 kHz, there would be little difference in the impedance paths to ground of the two adjacent pads when either is touched. This would result in the voltage on both pads being pulled towards ground by comparable amounts. Conversely, at 100 kHz, the glass impedance drops to approximately 1 MΩ resulting in the impedance of the path to ground for pad 59 being twice that of the touched pad 57. For cases where background noise and temperature drifts are comparatively small, a 100 kHz oscillator frequency would allow a sufficiently low detection threshold to be set to differentiate between the signal changes induced at both pads by a human touch opposite a single pad. At 800 kHz, the impedance of the glass drops to 200 kΩ or lower giving a ratio of a greater than 5 to 1 impedance difference between the paths to ground of the touched pad 57 and adjacent pads 59. In fact, the impedance ratio may exceed 10 to 1, as illustrated in the calculation below. This allows the detection threshold for the touched pad to be set well below that of an adjacent pad resulting in a much lower incidence of inadvertent actuation of adjacent touch pads to that of the touched pad. Ideally, the frequency of operation would be kept at the 800 kHz of the preferred embodiment or even higher. However, as noted earlier, higher frequency operation forces the use of more expensive components and designs. For applications where thermal drift and electronic noise levels are low, operation at or near 100 kHz may be possible. However, at 10 kHz and below, the impedance of the glass becomes much greater than that of likely water bridges between pads resulting in adjacent pads being effected as much by a touch as the touched pad itself. Although the preferred frequency is at or above 100 kHz, and more preferably at or above 800 kHz, it is conceivable that frequencies as low as 50 kHz could be used provided the frequency creates a difference in the impedance paths of adjacent pads that is sufficient enough to accurately distinguish between an intended touch and the touch of an adjacent pad. Use of frequencies as low as 50 kHz may also be possible depending upon the type of glass or covering or the thickness thereof used for the touch pad. However, in cases where there is little or no surface contamination, the frequency of operation can go well below 50 kHz. Ultimately, the frequency chosen will be a tradeoff between the likelihood of surface contamination and the cost of going to higher frequencies to prevent cross talk due to such contamination. The following analysis illustrates one example of how a frequency may be calculated based on the typical parameters used to construct a touch switch and the typical impedance of a contaminant, such as rain water. In the analysis below a 10 to 1 ratio of water to glass impedance is sought.

To eliminate crosstalk due to condensation of water on the glass, the impedance of body ($Z_B$) and glass ($Z_g$) combination must be much lower than impedance of water ($Z_W$). Since the impedance of glass is much higher than body impedance, $Z_g$ will be considered only. Therefore, $$10|Z_g| < |Z_W| \qquad \text{Eq. 3}$$

where, $$C_{glass} = 2 \text{ pF} \quad Z_W = 1 \text{ M}\Omega$$

$$Z_g = \frac{1}{2\pi f C_g} = \frac{7.96 \times 10^{10}}{f} \qquad \text{Eq. 4}$$

$$10 \times \left( \frac{7.96 \times 10^{10}}{f} \right) < 1 \text{ M}\Omega$$

Therefore, $$f > 796 \text{ kHz}$$

Having provided a basis for the use of higher frequencies, the basic construction of the electronic switching circuit constructed in accordance with a first embodiment of the present invention is now described with reference to FIG. 4. The electronic switching circuit includes a voltage regulator 100 including input lines 101 and 102 for receiving a 24 V AC line voltage and a line 103 for grounding the circuit. Voltage regulator 100 converts the received AC voltage to a DC voltage and supplies a regulated 5 V DC power to an oscillator 200 via lines 104 and 105. Voltage regulator also supplies oscillator 200 with 26 V DC power via line 106. The details of voltage regulator 100 are discussed below with reference to FIG. 5.

Upon being powered by voltage regulator 100, oscillator 200 generates a square wave with a frequency of 50 kHz, and preferably greater than 800 kHz, and having an amplitude of 26 V peak. The square wave generated by oscillator 200 is supplied via line 201 to a floating common generator 300, a touch pad shield plate 460, a touch circuit 400, and a microcontroller 500. Oscillator 200 is described below with reference to FIG. 6.

Floating common generator 300 receives the 26 V peak square wave from oscillator 200 and outputs a regulated floating common that is 5 volts below the square wave output from oscillator 200 and has the same phase and frequency as the received square wave. This floating common output is supplied to touch circuit 400 and microcontroller 500 via line 301 such that the output square wave from oscillator 200 and floating common output from floating common generator 300 provide power to touch circuit 400 and microcontroller 500. Details of floating common generator 300 are discussed below with reference to FIG. 7.

Touch circuit 400 senses capacitance from a touch pad 450 via line 451 and outputs a signal to microcontroller 500 via line 401 upon detecting a capacitance to ground at touch pad 450 that exceeds a threshold value. The details of touch circuit 400 are described below with reference to FIG. 8.

Upon receiving an indication from touch circuit 400 that a sufficient capacitance to ground (typically at least 20 pF) is present at touch pad 450, microcontroller 500 outputs a signal to a load-controlling microcontroller 600 via line 501, which is preferably a two way optical coupling bus. Microcontroller 600 then responds in a predetermined manner to control a load 700. Having generally described the basic construction of the first embodiment, the preferred detailed construction of the depicted components will now be described with FIGS. 5–8. In cases where the number of lines to be switched is low, microcontroller 600 can be replaced by additional optical coupling lines. The number of lines to be switched will dictate whether it is more cost effective to multiplex over a two line optical bus such as line 501 and use a microcontroller to demultiplex, or to use a multiplicity of optical coupling lines. Other considerations such as reliability and power consumption may also affect this choice. In this preferred embodiment, the use of a single pair of optical coupling paths (line 501) and a microcontroller 600, is shown to emphasize the capability to switch a large number of lines.

A preferred circuit for implementing a voltage regulator 100 is shown in FIG. 5. Voltage regulator 100 preferably includes an AC/DC convertor 110 for generating 29 V to 36 V unregulated DC on line 119. This unregulated DC power is supplied to a 5 V DC regulator 120 and to a 26 V DC regulator 130. AC/DC convertor 110 includes diodes 112, 114, 116, and 118, which rectify the supplied 24 V AC power provided on power lines 101 and 102. The anode of the first diode 112 is coupled to power line 101 and to the cathode of the second diode 114. The cathode of the first diode 112 is coupled to output line 119. The anode of the second diode 114 is coupled to ground via line 103 and to the anode of the fourth diode 118. The anode of the third diode 116 is coupled to the cathode of the fourth diode 118 and to power line 102. The cathode of the third diode 116 is coupled to line 119 and to the cathode of the first diode 112. The anode of the fourth diode 118 is coupled to ground via line 103. Diodes 112, 114, 116, and 118 are preferably diodes having part no. 1N4002 available from LITEON. AC/DC convertor 110 also preferably includes a capacitor 115 for filtering the rectified output of the diodes. Capacitor 115 is preferably a 1000 μF capacitor coupled between output line 119 and ground via line 103.

The 5 V regulator 120 preferably includes a 500 Ω resistor 122 coupled between line 119 and 5 V output line 104, and a zener diode 124, a first capacitor 126, and second capacitor 128 all connected and parallel between output power lines 104 and 105. Preferably, zener diode 124 is a 5.1 V zener diode having part no. 1N4733A available from LITEON, first capacitor 126 has a capacitance of 10 μF, and second capacitor 128 has a capacitance of 0.1 μF.

The 26 V regulator 130 preferably includes a transistor 134 having a collector connected to line 119 via a first resistor 132, a base connected to line 119 via a second resistor 136, and an emitter coupled to the regulated 26 V output power line 106. The 26 V regulator 130 also preferably includes a capacitor 137 and zener diode 138 connected in parallel between the base of transistor 134 and ground line 103. Preferably, first resistor 132 is a 20 Ω, 0.5 W resistor, second resistor 136 is a 1 kΩ, 0.5 W resistor, capacitor 137 is a 0.1 μF capacitor, and zener diode 138 is a 27 V, 0.5 W diode having part no. 1N5254B available from LITEON. It will be apparent to those skilled in the art, that various components of voltage regulator 100 may be added or excluded depending upon the source of power available to power the oscillator 200. For example, if the available power is a 110 V AC 60 Hz commercial power line, a transformer may be added to convert the 110 V AC power to 24 V AC. Alternatively, if a DC battery is used, the AC/DC convertor among other components may be eliminated.

A preferred example of an 800 kHz oscillator is shown in FIG. 6. Oscillator 200 preferably includes a square wave generator 210, which is powered by 5 V regulator 120 via lines 104 and 105, for generating a 5 V peak square wave having the desired frequency, and a buffer circuit 230 powered by 26 V regulator 130 via line 106 for buffering the output of square wave generator 210 and boosting its peak from 5 V to 26 V while maintaining the preferred frequency. Square wave generator 210 is preferably an astable multivibrator constructed with at least two serially connected invertor gates 212 and 214, and optionally, a third serially connected invertor gate 216. Invertor gates 212, 214 and 216 are preferably provided in a single integrated circuit designated as part 74HC04 available from National Semiconductor. The output of the first invertor gate 212 is coupled to it's input via resistors 218 and 222 and is coupled to the output of the second invertor gate 214 via a capacitor 224. The input of the second invertor gate 214 is directly connected to the output of the first invertor gate 212 and the output of the second invertor gate 214 is directly connected to the input of the optional third invertor gate 216. To provide an 800 kHz output, resistor 218 preferably has a 10.0 kΩ value, resistor 222 preferably has a 1.78 kΩ value, and capacitor 224 is preferably a 220 pF capacitor.

Figure 8:
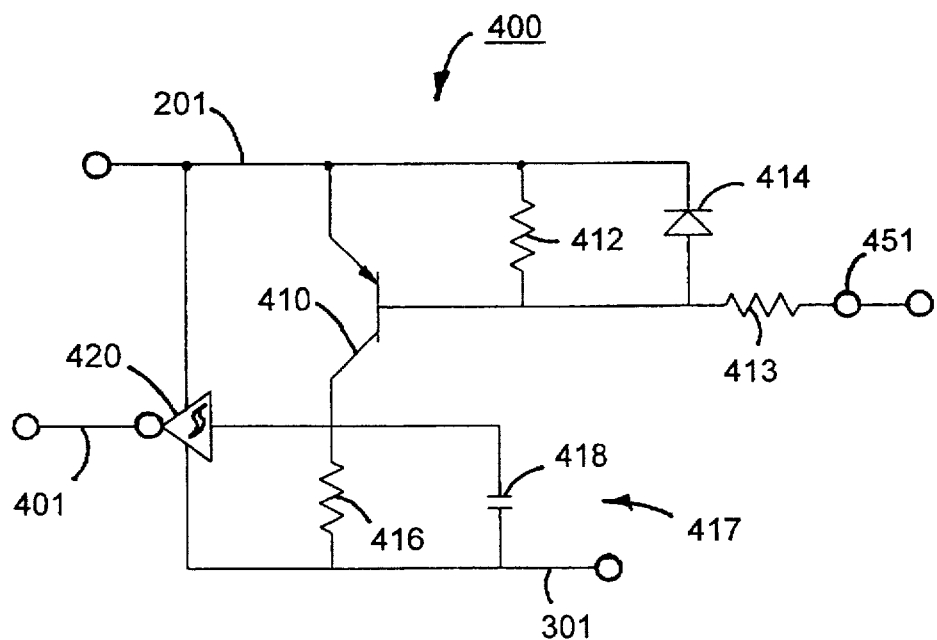
FIG. 8 is an electrical schematic of a preferred touch circuit for use in the capacitive responsive electronic switching circuit shown in FIG. 4.

The 5 V peak square wave generated by square wave generator 210 is supplied from either the output of invertor gate 214 or the output of optional invertor gate 216 to the base of a first transistor 238 via a first resistor 232 connected and parallel a capacitor 234. The base of first transistor 238 is connected to the 26 V regulated DC power line 106 via a second resistor 236. The collector of first transistor 238 is connected to 26 V power line 106 via a third resistor 240 and to the base of a second transistor 244. The emitter of first transistor 238 is coupled to ground and to it's own collector and the base of second transistor 244 via a fourth resistor 242. The collector of the second transistor 244 is connected directly to 26 V power line 106 and the emitter of second transistor 244 is connected to ground via a fifth resistor 246. Second transistor 244 provides the 26 V peak square wave on output line 201, which is connected to it's emitter. In operation, the square wave signal applied to the base of transistor 238 causes the collector of transistor 238 to swing between near to the DC supply 106 voltage and the collector-emitter saturation voltage. Capacitor 234 is provided to improve the turning off of transistor 238. Transistor 244 along with resistors 242 and 246 are used to buffer the square wave signal generated by transistor 238. In a preferred embodiment, the values of the resistors and capacitor are as follows: first resistor 232 is 5.1 kΩ, capacitor 234 is 0.0047 μF, second resistor 236 is 1 MΩ, third resistor 240 is 1.6 kΩ, fourth resistor 242 is 100 kΩ, and fifth resistor 246 is 4.7 kΩ. Preferably, transistors 238 and 244 are those identified as part no. ZTX600 available from ZETEX. In this configuration, the oscillator 200 sources 80 mA to the floating common generator 300 such that together they supply a floating 5 V DC to power touch circuit(s) 400, microcontroller 500, and Schmitt triggered gates 420 (FIG. 8). As will be apparent to those skilled in the art, the values of the resistors and capacitors utilized in oscillator 200 may be varied from those disclosed above to provide for different oscillator output frequencies. As discussed above, however, oscillator 200 is preferably constructed so as to output a square wave having a frequency of 50 kHz or greater, and more preferably, of 800 kHz or greater. In some cases it may be necessary to use lower gain bandwidth product transistors or filtration to achieve a softer roll-off of the square edges to reduce high frequency noise emissions. When this is done the amplitude of the oscillator voltage can be increased to compensate.

The preferred construction of floating ground generator 300 is shown in FIG. 7 includes a zener diode 310 having a cathode connected to the oscillator output on line 201 and an anode connected to floating ground output line 301 and to ground via resistor 316 and diode 318. Floating ground generator 300 also preferably includes a first capacitor 312 and a second capacitor 314 connected in parallel with zener diode 310. In the preferred embodiment, zener diode 310 is a 5.1 V zener diode identified by part no. 1N4733A available from LITEON, capacitor 312 is a 47 μF tantalum capacitor, capacitor 314 is a 0.1 μF capacitor, resistor 316 is a 270 Ω resistor, and diode 318 is a diode identified as part no. 1N914B available from LITEON.

Touch circuit 400, as shown in FIG. 8, preferably includes a transistor 410 having a base connected to touch pad 450 via resistor 413 and line 451, an emitter coupled to oscillator output line 201, and a collector coupled to floating ground line 301 via a pulse stretcher circuit 417, which includes a resistor 416 and a capacitor 418 connected in parallel. To minimize susceptibility to noise, the physical length of the path between the touch pad 450 and the base of the transistor 410, must be held to a minimum. Additionally, RC filters can be placed in line 401 between the output of the touch circuit 400 and the input of the microcontroller 500 to give additional EMI/RFI immunity. Additionally, the higher the frequency, the higher the gain bandwidth product that is required in transistor 410. The gain bandwidth product must be sufficient to guarantee that the oscillator turns on during oscillator High pulses. A further trade-off is to use higher gain bandwidth product to allow lower oscillator voltages or higher oscillator voltages to all allow a lower gain bandwidth product transistor to be used. The combination of oscillator voltage, frequency and transistor gain bandwidth product that is used will necessarily vary with the cost, safety and reliability requirements of a given application. The present combination was chosen to keep the oscillator voltage down and allow operation at 800 kHz to minimize cross talk. At higher frequencies a higher gain bandwidth product transistor would be required in both the oscillator 200 and detection 400 circuits. Touch circuit 400 also preferably includes resistor 412 and a diode 414 having an anode connected to the base of transistor 410 and to resistor 413, and a cathode connected to the emitter of transistor 410 and to a resistor 412 connected in parallel with diode 414 between the base and emitter of transistor 410. The pulse stretcher circuit 417 is identified as such because the sensitivity of the touch circuit may be increased or decreased by varying the resistance of resistor 416. The base of transistor 410 is connected via resistor 413 to line 451 connected to touch pad 450.

Additionally, touch circuit 400 may include at least one Schmitt triggered gate 420 powered by the voltage difference existing between oscillator line 201 and 301, and having an input terminal coupled to the collector of transistor 410 and an output coupled to microcontroller 500 via output line 401. Schmitt triggered invertor gate 420 is optionally provided to improve the rise time of the touch switch output and to buffer the output. Preferably, transistor 410 is part no. BC858CL available from Motorola, resistor 412 is a 12 MΩ resistor, diode 414 is part no. 1N914B available from Diodes, Inc., resistor 416 is a 470 kΩ resistor, capacitor 418 is a 0.001 µF capacitor, and resistor 413 is a 10 kΩ resistor.

As stated above, the operator's body includes a capacitance to ground, which may range in a typical person from between 20 to 300 pF. The base terminal of transistor 410 is coupled to it's emitter by resistor 412 such that unless capacitance is present by the user touching the touch pad 450, transistor 410 will not be forward biased and will not conduct. Thus, when touch pad 450 is not touched, the output signal at the collector terminal of transistor 410 and across pulse stretcher circuit 417 will be zero volts. When, however, a person touches the touch pad 450, that person's body capacitance to ground couples the base of transistor 410 to ground 103 through resistor 413, thereby forward biasing transistor 410 into conduction. This charges capacitor 418 providing a positive DC voltage with respect to the line 301 and causes the output of the Schmitt trigger 420 to go low. Diode 414 is coupled across the base to emitter junction of transistor 410 to clamp the base emitter reverse bias voltage to −0.7 V and also reduce the forward recovery and turn-on time.

Touch pad 450 includes a substrate on which a plurality of electrically conductive plate members are mounted on one surface thereof. The substrate is an insulator and the plates are spaced apart in order to insulate the plates from one another and from ground. Also, positioned on the substrate is a guard band, generally shown as 460. Guard band 460 is a grid of conductor segments extending between adjacent pairs of plate members. All conductor segments are physically interconnected to define a plurality of spaces with one plate member positioned centrally within each space. Components of the touch circuit may be positioned on the side of substrate opposite plate members and guard band 460.

A planar dielectric member is spaced from the substrate facing plate members. The dielectric member is made from a non-porous insulating material such as polycarbonate or glass. A plurality of electrically conductive spring contacts are sandwiched between the inner surface of the dielectric member and the substrate. An indicia layer may be adhered to the inner surface of the dielectric member to provide an indication of the function of each input portion.

As mentioned above, interface between the dielectric member and a conductive plate is a metallic spring contact that is attached to the back of the dielectric member. The spring contacts offer advantages at high temperature extremes. However, for sufficiently narrow temperature ranges, conductive polymer foam pads cut to the size of the touch pads are preferably used to fill the gap between conductive pad and dielectric layer. The function of the spring contacts or conductive foam pads is to eliminate that capacitive contribution of the air filled gap between the conductive pads and the overlying dielectric layer.

A problem with capacity responsive keyboards is the tendency of switches that are closely positioned in a keyboard system to inadvertently become actuated even though the user is touching an adjacent switch. Furthermore, this problem is greatly aggravated by the presence of contamination on the outer surface of dielectric member. Contamination such as skin oil or moisture causes erratic keyboard operation and multiple switches will turn on even though one switch is touched. By operating at a high frequency such as 100 kHz or 800 kHz, the impedance of the series combination of body and glass capacitance are lowered as compared to the impedance of contamination present on the glass thereby reducing crosstalk.

If glass thickness is smaller than 3/16 inch, the touch circuit becomes more sensitive to body capacitance. There are two ways to adjust the sensitivity so that crosstalk does not occur: remove diode 414 and/or reduce the resistance of resistor 416. Increasing the resistance of resistor 416 would allow usage of thicker glass. However, this resistance preferably should not go above 750 kΩ. This is because of the maximum low input voltage of 0.8 V and input leakage current of 1 µA at the Schmitt trigger gate 420.

The oscillator circuitry shown in FIG. 6 is very stable over the temperature range of −40° C. to 105° C. The output of the touch switch circuitry drops at a rate of approximately 40 mV/°C. when temperature falls below 0° C. If application requires operation at low temperatures (−40° C.), the following three methods may be used to increase the output of the switch: increase the oscillator's regulated supply voltage, increase the resistance of resistor 416, and use a higher gain transistor 410. All of these methods would increase sensitivity at high temperatures. Another way to correct this problem is to use a thermistor to vary the regulated supply voltage as a function of temperature.

Since the input power is regulated down to 26 V DC, variation of power (24 V AC±10% or 29 V DC to 36 V DC) does not affect circuit operation. Table 3 below shows the measured output voltage of the switch for various supply voltages.

TABLE 3

| SUPPLY VOLTAGE | SWITCH OUTPUT |
| --- | --- |
| 36 VDC | 4.96 V |
| 35 VDC | 4.96 V |
| 34 VDC | 4.95 V |
| 33 VDC | 4.95 V |
| 32 VDC | 4.94 V |
| 31 VDC | 4.93 V |
| 30 VDC | 4.93 V |
| 29 VDC | 4.92 V |

PSRR=6 mV/V=−45 dB

In order to determine the effect of body capacitance on circuit operation, the circuit of FIG. 3 was used to simulate glass, water resistance, and body capacitance. The following two conditions were simulated and tested:

1—The maximum body capacitance that does not cause crosswalk when:
Temperature=105° C.
Supply Voltage=36VDC
Glass Capacitance=2 pF
Water Resistance=330 k to 1 MΩ
2—The minimum capacitance to turn on a switch when:
Temperature=0° C.
Supply Voltage=29VDC
Glass Capacitance=2 pF
3—Operation at room temperature.

Table 4 below shows the signal and noise voltages at the switch output for different values of body capacitance and contamination resistance.

TABLE 4

| CONTAM-INATION RESISTANCE | BODY CAPACITANCE | | | | |
|---|---|---|---|---|---|
| | 20 pF | 220 pF | 330 pF | 550 pF | 1230 pF |
| 330 kΩ | S: 5.1 V<br>N: 2.0 V | S: 5.1 V<br>N: 4.0 V | S: 5.1 V<br>N: 4.5 V | S: 5.1 V<br>N: 4.9 V | S: 5.1 V<br>N: 5.0 V |
| 500 kΩ | S: 5.1 V<br>N: 0.2 V | S: 5.1 V<br>N: 0.6 V | S: 5.1 V<br>N: 0.7 V | S: 5.1 V<br>N: 0.8 V | S: 5.1 V<br>N: 0.8 V |
| 1 MΩ (Condensed Water) | S: 5.1 V<br>N: 0.1 V | S: 5.1 V<br>N: 0.1 V | S: 5.1 V<br>N: 0.1 V | S: 5.1 V<br>N: 0.1 V | S: 5.1 V<br>N: 0.1 V |
| NONE | S: 5.1 V<br>N: 10 mV | S: 5.1 V<br>N: 10 mV | S: 5.1 V<br>N: 10 mV | S: 5.1 V<br>N: 10 mV | S: 5.1 V<br>N: 10 mV |

S = Signal (TOUCH)
N = Noise (NO TOUCH)
supply voltage = 36 VDC
temperature = 105° C.

Figure 9:
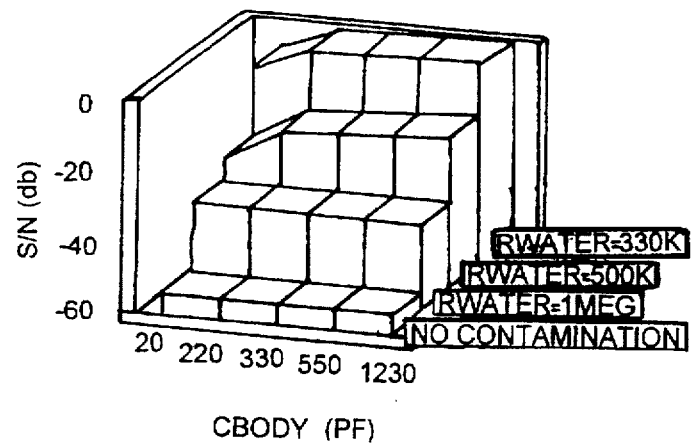
FIG. 9 is a three dimensional bar graph illustrating signal-to-noise ratio vs. body capacitance at T=105° C.

With contamination resistance of 1 MΩ or more, the circuit is insensitive to body capacitance variations and has a minimum signal-to-noise ratio of −34 dB. With no contamination, signal-to-noise ratio is approximately −54 dB. The graph in FIG. 9 shows the signal-to-noise ratio versus body capacitance, for different values of contamination resistance at 105° C. The minimum body capacitance to turn on a switch is 20 pF.

At room temperature, crosstalk decreases because of gain drop of transistor 410. Table 5 below shows that at room temperature, the circuit rejects 250 kΩ of contamination, independent of body capacitance. Below 250 kΩ, body capacitance will affect crosstalk.

TABLE 5

| CONTAM-INATION RESISTANCE | BODY CAPACITANCE | | | | |
|---|---|---|---|---|---|
| | 20 pF | 220 pF | 330 pF | 550 pF | 1230 pF |
| 200 kΩ | S: 5.1 V<br>N: 0.2 V | S: 5.1 V<br>N: 1.0 V | S: 5.1 V<br>N: 1.2 V | S: 5.1 V<br>N: 1.8 V | S: 5.1 V<br>N: 2.2 V |
| 250 kΩ | S: 5.1 V<br>N: 0.1 V | S: 5.1 V<br>N: 0.1 V | S: 5.1 V<br>N: 0.5 V | S: 5.1 V<br>N: 0.5 V | S: 5.1 V<br>N: 0.5 V |
| 330 kΩ | S: 5.1 V<br>N: 0.1 V | S: 5.1 V<br>N: 0.1 V | S: 5.1 V<br>N: 0.1 V | S: 5.1 V<br>N: 0.1 V | S: 5.1 V<br>N: 0.1 V |
| 1 MΩ (Condensed Water) | S: 5.1 V<br>N: 0.1 V | S: 5.1 V<br>N: 0.1 V | S: 5.1 V<br>N: 0.1 V | S: 5.1 V<br>N: 0.1 V | S: 5.1 V<br>N: 0.1 V |

S = Signal (TOUCH)
N = Noise (NO TOUCH)
supply voltage = 36 VDC
temperature = 25° C.

Figure 10:
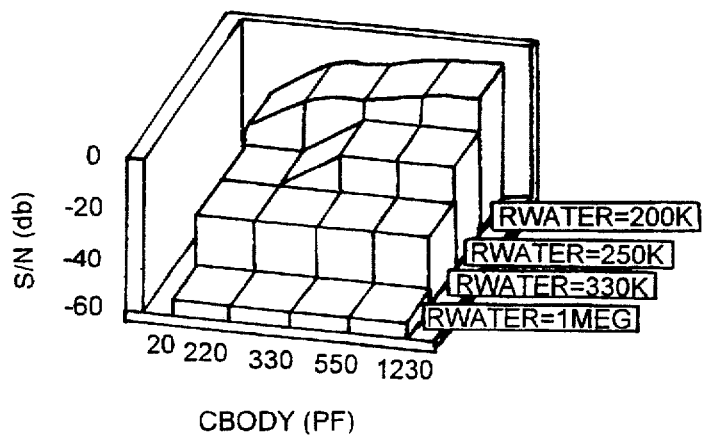
FIG. 10 is a three dimensional bar graph illustrating signal-to-noise ratio vs. body capacitance at T=22° C.

The graph of FIG. 10 shows the measured signal-to-noise ratio versus body capacitance, for different contamination resistance values at room temperature.

The particular advantages of the preceding circuit over that of existing touch detection circuits such as that disclosed in U.S. Pat. No. 4,758,735, are the use of diode 414 (selected for high speed) to minimize forward recovery time rather than merely provide reverse polarity protection (as with the slower type of diode used in the existing circuits) and the omission of a capacitor coupled across the base to emitter junction of the detection transistor 410 to make the circuit more sensitive and operable with a lower oscillator amplitude and higher oscillator frequency. These features along with appropriate choices in component values make possible operation at significantly higher frequencies (>50 to 800 kHz) than are seen in existing art (60 to 1000 Hz). At frequencies at or near 800 kHz, the 20–300 pF of capacitance to ground offered by the human body presents a considerably lower impedance than the primarily resistive impedance of skin oil or water films that may appear on the dielectric layer overlying the conductive touch pads. This allows the peak voltage of a pad that is touched to come considerably closer to ground than adjacent pads which will have a voltage drop across any contaminating film layer that is providing a conductive path to the area that is touched. The enhanced sensitivity offered by the omission of any capacitor between the base and emitter of the detection transistor 410, allows the threshold of detection to be set much closer to ground than would be the case otherwise. This allows discrimination between the pad that is touched and adjacent pads that might be pulled towards ground via the conductive path to the touch formed by a contaminating film. This high frequency regime of operation offers a considerable advantage relative to the existing art in terms of immunity to surface contaminants such as skin oil and moisture.

Figure 11:
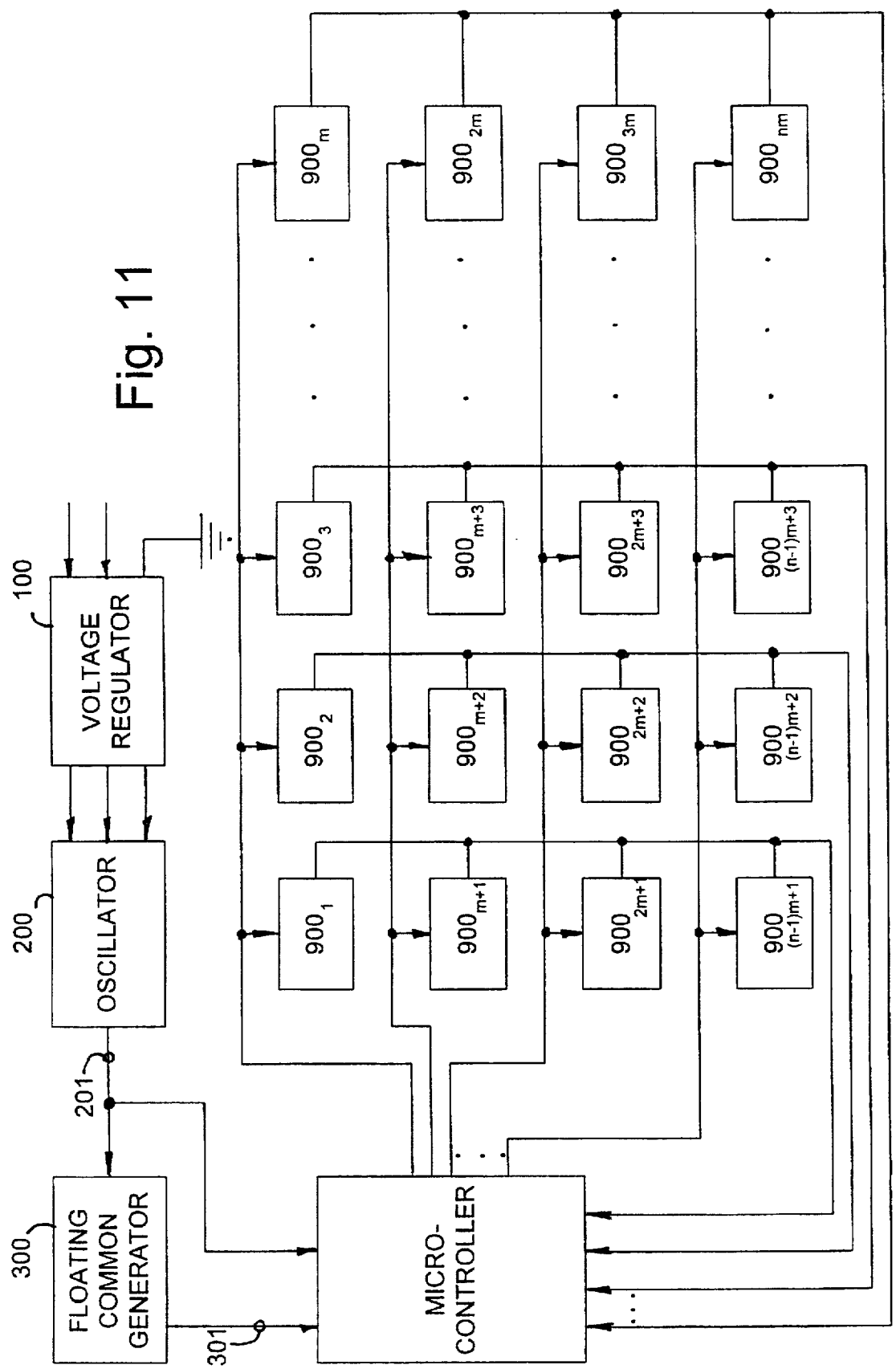
FIG. 11 is a block diagram of a capacitive responsive electronic switching circuit constructed in accordance with a second embodiment of the present invention.

A multiple touch pad circuit constructed in accordance with the second embodiment is shown in FIG. 11. In the second embodiment of FIG. 11, components similar to those in the first embodiment in FIG. 4 are designated with the same references numerals and will not be discussed in detail. The multiple touch pad circuit is a variation of the first embodiment in that it includes an array of touch circuits designated as $900_1$ through $900_{nm}$, which, as shown, include both the touch circuit 400 shown in FIGS. 4 and 8 and the input touch terminal pad 451 (FIG. 4). Microcontroller 500 selects each row of the touch circuits $900_1$ to $900_{nm}$ by providing the signal from oscillator 200 to selected rows of touch circuits. In this manner, microcontroller 500 can sequentially activate the touch circuit rows and associate the received inputs from the columns of the array with the activated touch circuit(s). To keep the path length 451 between the touch pad 450 and the base to the detection transistor 410 to a minimum, the detection circuits 900 are physically located directly beneath the touch pads. To simplify assembly, a flexible circuit board such as vended by Sheldahl, Inc. or Circuit Etching Technics, Inc. can be used for this purpose. Ideally, the printed circuit will be fixed directly against the surface (typically glass) bearing the conductive touch pads to eliminate air gaps and the need for conductive foam pads and spring contacts which were used to fill air gaps.

For this second embodiment, the oscillator 200 of the first embodiment may be slightly modified from that shown in FIG. 6 to include a transistor (not shown) coupled between the oscillator output and ground with it's base connected to microcontroller 600 such that microcontroller 600 may selectively disable the output of oscillator 200.

The use of a high frequency in accordance with the present invention provides distinct advantages for circuits such as the multiple touch pad circuit of the present invention due to the manner in which crosstalk is substantially reduced without requiring any physical structure to isolate the touch terminals. Further, the reduction in crosstalk afforded by the present invention, allows the touch terminals in the array to be more closely spaced together.

Figure 12:
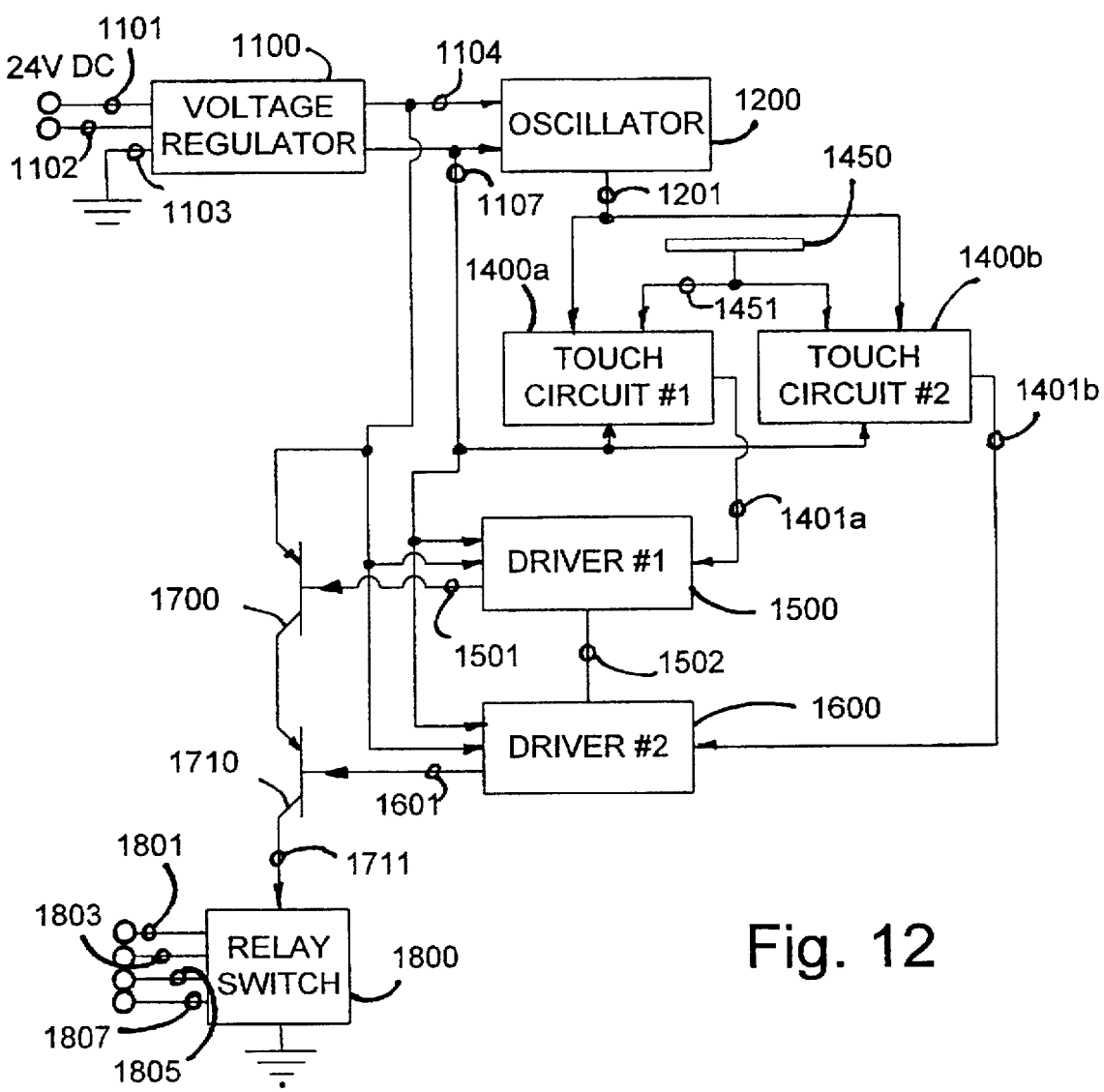
FIG. 12 is a block diagram of a capacitive responsive electronic switching circuit constructed in accordance with a third embodiment of the present invention.

A third embodiment of the present invention, which provides touch circuit redundancy, is described below with reference to FIGS. 12–14. As shown in FIG. 12, the switching circuit according to the third embodiment includes a voltage regulator 1100 for regulating power supplied by 24 V DC power lines 1101 and 1102 with ground connection 1103, for supplying the regulated power to an oscillator 1200 via lines 1104 and 1107.

Oscillator 1200 supplies a continuous and periodic signal to touch circuits 1400a and 1400b via line 1201. Preferably, the frequency of the oscillator output signal is at least 100 kHz, and more preferably, at least 800 kHz. The two touch circuits 1400a and 1400b are identical in construction and both receive the output of touch terminal 1450 via line 1451. A detailed description of the preferred voltage regulator circuit 1100, oscillator 1200, and touch circuits 1400a and 1400b is provided below with reference to FIG. 13 following the description of the remaining portion of the third embodiment.

The output of the first touch circuit 1400a is supplied to a first driver circuit 1500 via line 1401a while the output of the second touch circuit 1400b is supplied to a second driver circuit 1600 via line 1401b. The two driver circuits 1500 and 1600 are provided to drive first and second serially connected switching transistors 1700 and 1710. The switching transistors 1700 and 1710 must both be conducting to supply power to a relay switch 1800. Thus, if one of touch circuits 1400a and 1400b does not detect a touch of touch terminal 1450, one of switching transistors 1700 and 1710 will not conduct and power will not be supplied to relay switch 1800. The preferred construction of driver circuits 1500 and 1600 and relay switch 1800 are described below with reference to FIG. 14.

Figure 13:
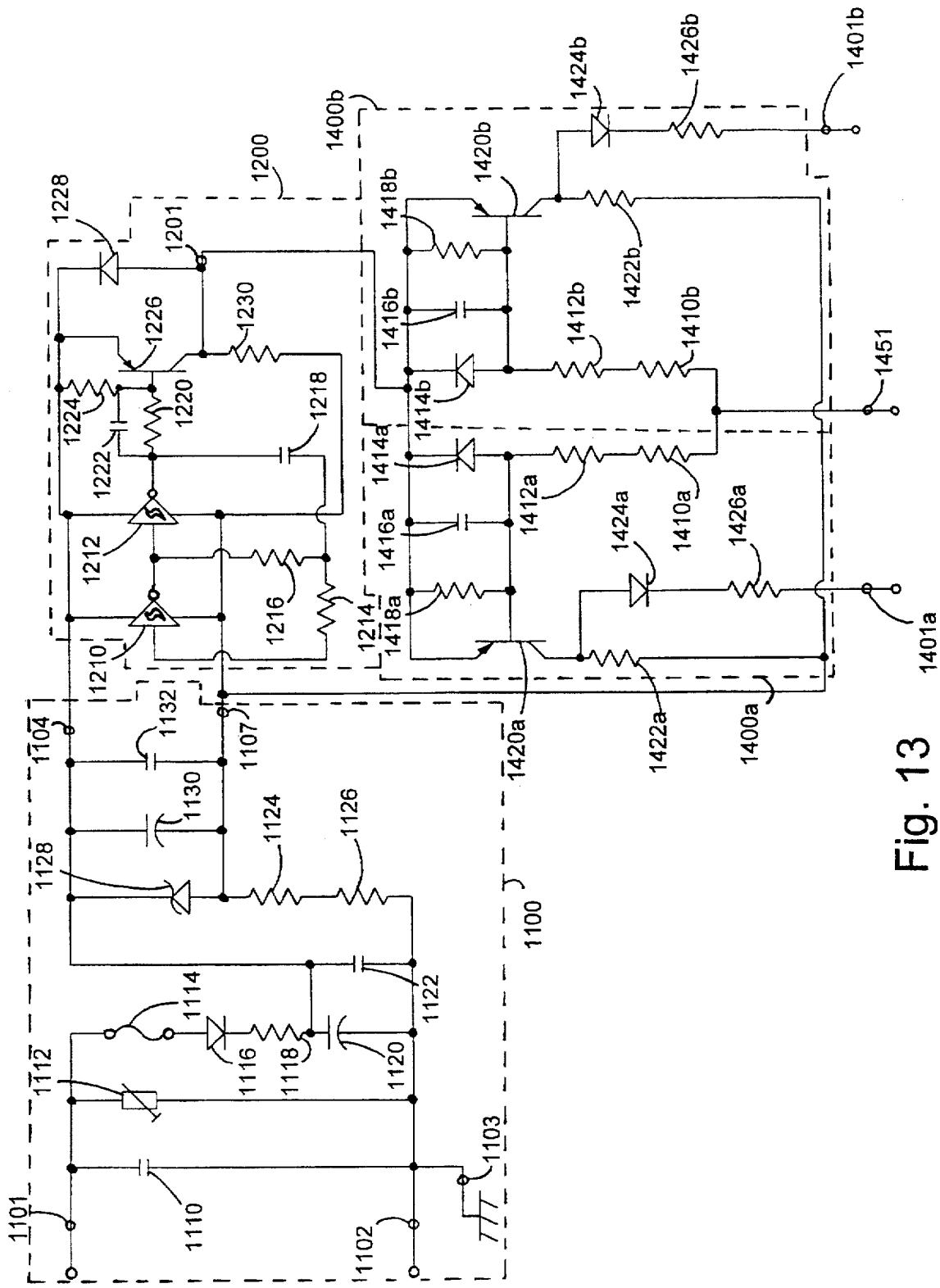
FIG. 13 is an electrical schematic of a preferred voltage regulator, oscillator, and touch circuits for use in the capacitive responsive electronic switching circuit shown in FIG. 12.
Figure 14:
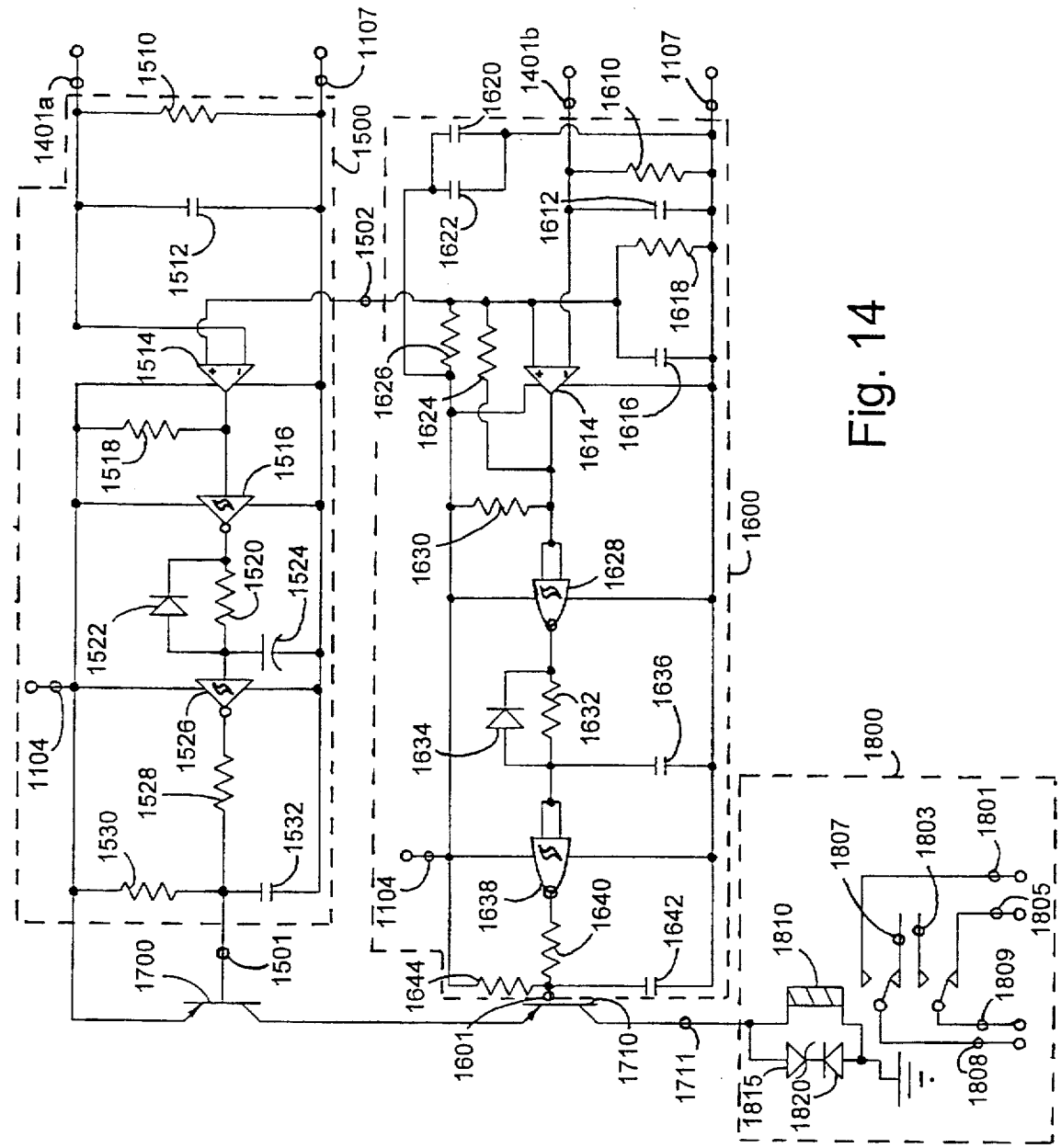
FIG. 14 is an electrical schematic of preferred driver circuits for use in the capacitive responsive electronic switching circuit shown in FIG. 12.

As shown in FIG. 13, voltage regulator 1100 may be constructed by providing a first capacitor 1110 and a varistor 1112 connected in parallel across input power terminals 1101 and 1102. Preferably, return power terminal 1102 is connected via line 1103 to ground. Varistor 1112 is used to protect the circuit for over-voltage conditions. Also connected in parallel with first capacitor 1110 and varistor 1112, are the serially connected combination of a fuse 1114, a diode 1116, a resistor 1118 and two parallel connected capacitors 1120 and 1122. The voltage regulator 1100 is reverse polarity protected by diode 1116 and current limited by resistor 1118. Capacitors 1120 and 1122 provide filtering.

Voltage regulator 1100 further includes a zener diode 1128 having it's cathode connected to a node between resistor 1118 and capacitors 1120 and 1122 and to output power line 1104. The anode of zener diode 1128 is coupled to output power common line 1107 and to ground line 1103 via two serially connected resistors 1124 and 1126. Zener diode 1128 and resistors 1124 and 1126 generate regulated 15 V DC. Two capacitors 1130 and 1132 are connected in parallel with zener diode 1128 between power lines 1104 and 1107. Capacitors 1130 and 1132 provide filtering and decoupling, respectively. Preferably, capacitor 1110 has a capacitance of 1000 pF, 1000V, varistor 1112 is part no. S14K25 available from Siemens, fuse 1114 is a ¼A fuse, diode 1116 is part no. 1N4002 available from LITEON, resistor 1118 has a resistance of 10Ω, ½W, capacitor 1120 has a capacitance of 22 µF, 35V, capacitor 1122 has a capacitance of 0.1 µF, zener diode 1128 is part no. 1N4744A available from LITEON, resistor 1124 has a resistance of 220Ω, resistor 1126 has a resistance of 220Ω, capacitor 1130 has a capacitance of 1 µF, 25V, and capacitor 1132 has a capacitance of 0.1 µF.

Oscillator 1200 is preferably comprised of a first invertor gate 1210 having it's input coupled to it's output via resistors 1214 and 1216, and a second invertor gate 1212 having it's input coupled to the output of first invertor gate 1210 and it's output coupled to it's input via a capacitor 1218 and resistor 1216. The oscillating output of the second invertor gate 1212 is buffered via transistor 1226, which has it's base connected to the output of second invertor gate 1212 via resistor 1220 and capacitor 1222, which are connected in parallel therebetween. The base of transistor 1226 is also coupled to power line 1104 via a resistor 1224. The emitter of transistor 1226 is connected to power line 1104 and the collector is connected to power line 1107 via a resistor 1230, to the anode of a diode 1228, and to the oscillator output line 1201. Diode 1228 has it's cathode connected to power line 1104 and is used to protect transistor 1226.

Preferably, invertor gates 1210 and 1212 are provided by part no. CD40106B available from Harris, resistor 1214 has a resistance of 10 kΩ, resistor 1216 has a resistance of 1.18 kΩ, 1%, capacitor 1218 has a capacitance of 220 pF, resistor 1220 has a resistance of 4.7 kΩ, capacitor 1222 has a capacitance of 220 pF, resistor 1224 has a resistance of 100 kΩ, transistor 1226 is part no. MMBTA70L available from Motorola, diode 1228 is part no. RLS4448 available from LITEON, and resistor 1230 has a resistance of 3.3 kΩ.

Two touch circuits 1400a and 1400b are provided in parallel to provide redundancy so that if one fails, the relay drivers are disabled. Because the touch circuits 1400a and 1400b are identical, only one of the touch circuits will now be described. Touch circuit 1400a preferably includes two resistors 1410a and 1412a coupled in series between touch terminal output line 1451 and the base of a bipolar PNP transistor 1420a. Transistor 1420a has it's emitter connected to the oscillator output line 1201 and it's collector connected to power common line 1107 via a resistor 1422a. Touch circuit 1400a further includes a diode 1414a, a capacitor 1416a, and a resistor 1418a all connected in parallel between the base of transistor 1420a and the emitter thereof, which is connected to oscillator output line 1201. Touch circuit 1400a also includes a diode 1424a having it's anode connected to the collector of transistor 1420a and it's cathode connected to touch circuit output line 1401a via a resistor 1426a.

Preferably, resistor 1410a has a resistance of 5.1 kΩ, resistor 1412a has a resistance of 5.1 kΩ, diode 1414a is part no. RLS4448 available from LITEON, capacitor 1416a has a capacitance of 240 pF, resistor 1418a has a resistance of 12 MΩ, transistor 1420a is part no. BC857CL available from Motorola, resistor 1422a has a resistance of 100 kΩ, diode 1424a is part no. RLS4448 available from LITEON, and resistor 1426a has a resistance of 100 kΩ.

The preferred detailed construction of the first and second driver circuits 1500 and 1600 will now be described with reference to FIG. 14. In first driver circuit 1500, the output line 1401a of first touch circuit 1400a is connected to power common line 1107 via a resistor 1510 and also via a capacitor 1512 connected in parallel therewith. The output line 1401a is also connected to the inverting input terminal of an operational amplifier 1514. The non-inverting input terminal of operational amplifier 1514 is connected to line 1502, which runs between first and second driver circuits 1500 and 1600 and is connected to power line 1104 via a resistor 1626. The output of op amp 1514 is connected to power line 1104 via a resistor 1518 and to the input of a Schmitt trigger invertor gate 1516. The output of Schmitt trigger invertor gate 1516 is connected to the input of a second Schmitt trigger invertor gate 1526 via a resistor 1520. A diode 1522 is connected in parallel with resistor 1520 with it's cathode connected to the output of invertor gate 1516 and it's anode connected to the input of invertor gate 1526 and to power common line 1107 via capacitor 1524. The output of invertor gate 1526 is connected to the base of bipolar PNP switching transistor 1700 via a resistor 1528. The base of transistor 1700 is also connected to power common line 1107 via a capacitor 1532 and to power line 1104 and it's emitter via a resistor 1530.

Preferably, resistor 1510 has a resistance of 10 M$\Omega$, capacitor 1512 has a capacitance of 0.01 µF, op amp comparator 1514 is part no. LM393 available from National Semiconductor, invertor gate 1516 is part no. CD40106B available from Harris, resistor 1518 has a resistance of 10 k$\Omega$, resistor 1520 has a resistance of 1 M$\Omega$, diode 1522 is part no. RLS4448 available from LITEON, capacitor 1524 has a capacitance of 0.22 µF, invertor gate 1526 is part no. CD40106 available from Harris, resistor 1528 has a resistance of 12 k$\Omega$, resistor 1530 has a resistance of 100 k$\Omega$, capacitor 1532 has a capacitance of 0.01 µF, and transistor 1700 is part no. MMBTA56L available from Motorola.

In second driver circuit 1600, the output line 1401b of second touch circuit 1400b is connected to power common line 1107 via a resistor 1610 and also via a capacitor 1612 connected in parallel therewith. The output line 1401b is also connected to the inverting input terminal of an operational amplifier 1614. The non-inverting input terminal of operational amplifier 1614 is connected to line 1502, which is connected to power line 1104 via resistor 1626. The non-inverting input terminal of op amp 1614 is also connected to power common line 1107 via a capacitor 1616 and a resistor 1618, which are connected in parallel. The output of op amp 1614 is connected to power line 1104 via a resistor 1630 and to the coupled inputs of a Schmitt trigger invertor gate 1628. The output of op amp 1614 is also connected to it's non-inverting input terminal via a resistor 1624. The output of Schmitt trigger invertor NAND gate 1628 is connected to the input of a second Schmitt trigger invertor gate 1638 via a resistor 1632. A diode 1634 is connected in parallel with resistor 1632 with it's cathode connected to the output of invertor NAND gate 1628 and it's anode connected to the input of invertor NAND gate 1638 and to power common line 1107 via a capacitor 1636. The output of invertor gate 1638 is connected to the base of switching bipolar PNP transistor 1710 via a resistor 1640. The base of transistor 1710 is also connected to power common line 1107 via a capacitor 1642 and to power line 1104 via a resistor 1644. Second driver circuit 1600 also preferably includes capacitors 1620 and 1622 connected in parallel between it's connections to power lines 1104 and 1107.

Preferably, resistor 1610 has a resistance of 10 M$\Omega$, capacitor 1612 has a capacitance of 0.01 µF, op amp comparator 1614 is part no. LM393 available from National Semiconductor, capacitor 1616 has a capacitance of 0.01 µF, resistor 1618 has a resistance of 20 k$\Omega$, capacitor 1620 has a capacitance of 0.1 µF, capacitor 1622 has a capacitance of 0.1 µF, resistor 1624 has a resistance of 100 k$\Omega$, resistor 1626 has a resistance of 10 k$\Omega$, invertor NAND gate 1628 is part no. CD4093B available from Harris, resistor 1630 has a resistance of 10 k$\Omega$, resistor 1632 has a resistance of 1 M$\Omega$, diode 1634 is part no. RLS4448 available from LITEON, capacitor 1636 has a capacitance of 0.22 µF, invertor NAND gate 1638 is part no. CD4093B available from Harris, resistor 1640 has a resistance of 12 k$\Omega$, capacitor 1642 has a capacitance of 0.01 µF, resistor 1644 has a resistance of 100 k$\Omega$, and transistor 1710 is part no. MMBTA56L available from Motorola.

In operation, the output of transistor 1420a (FIG. 13) taken at it's collector is rectified by diode 1424a and a DC level is generated by resistors 1426a and 1510 and capacitor 1512 (a DC level of the output of transistor 1420b is generated by resistors 1426b and 1610 and capacitor 1612). When this DC level exceeds the upper threshold voltage of op amp comparator 1514 (1614), the output of schmitt triggered invertor gate 1516 inverter NAND gate 1628 (1628) goes high which charges capacitor 1524 (1636) through resistor 1520 (1632). Gates 1516 and 1526 (1628 and 1638), resistor 1520 (1632), and capacitor 1524 (1636) provide debounce in a conventional manner. Diode 1522 (1634) is used to provide fast release when the palm of the hand is removed from the touch terminal 1450. The output of the debounce circuitry drives transistor 1700 (1710). Resistor 1528 (1640) and capacitor 1532 (1642) are used to filter noise. Both touch circuits must be functional in order to drive the relay switch 1800. Also, if one of the transistors 1700 or 1710 fails, the relay will not be activated.

Relay switch 1800 may be any conventional relay. An example of such a relay is shown in FIG. 14. Relay switch 1800 may include a relay coil 1810 coupled between the selective power supply 1711 of transistors 1700 and 1710 and ground, and a pair of magnetically responsive switches that switch from normally closed terminals 1805 and 1807 to normally open terminals 1801 and 1803 when the relay coil is energized. A zener diode 1815 may be placed in series with a diode 1820 to reduce stress on the relay coil 1810 and to protect transistor 1710 when transistors 1700 and 1710 switch off.

Although the touch circuits of the third embodiment are disclosed as operating a relay switch via driver circuits, it will be appreciated by those skilled in the art that the outputs of touch circuits 1400a and 1400b could be supplied to a microcontroller in the manner discussed above with respect to the first embodiment.

The palm button switch of the present invention uses two redundant touch switch circuits, such as shown in FIG. 12, to disable relay drivers if one of the touch switch circuits fails and redundant relay driver circuitry to turn off a relay switch if one of the driver circuits fails.

Figure 4:
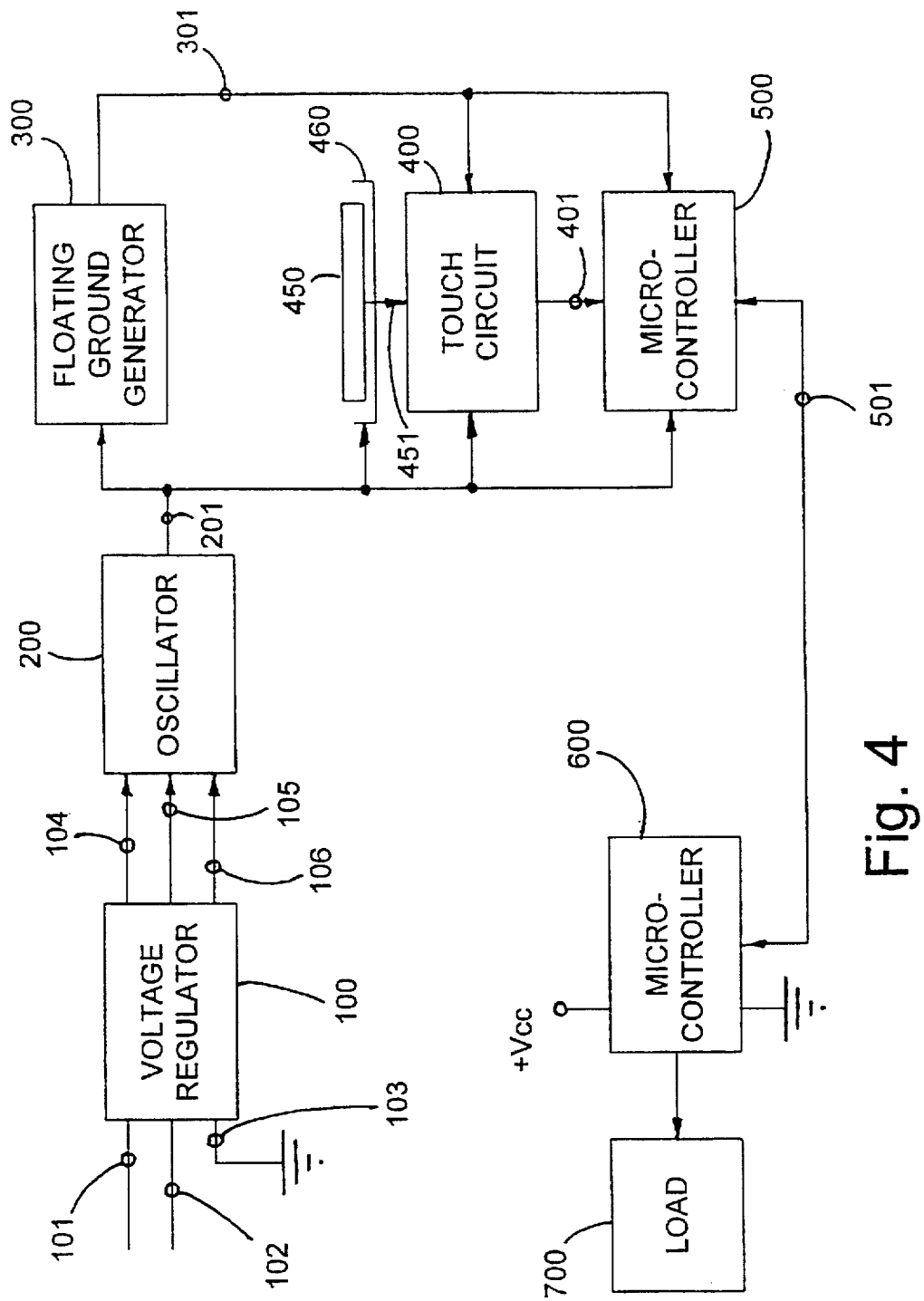
FIG. 4 is a block diagram of a capacitive responsive electronic switching circuit constructed in accordance with a first embodiment of the present invention.
Figure 19:
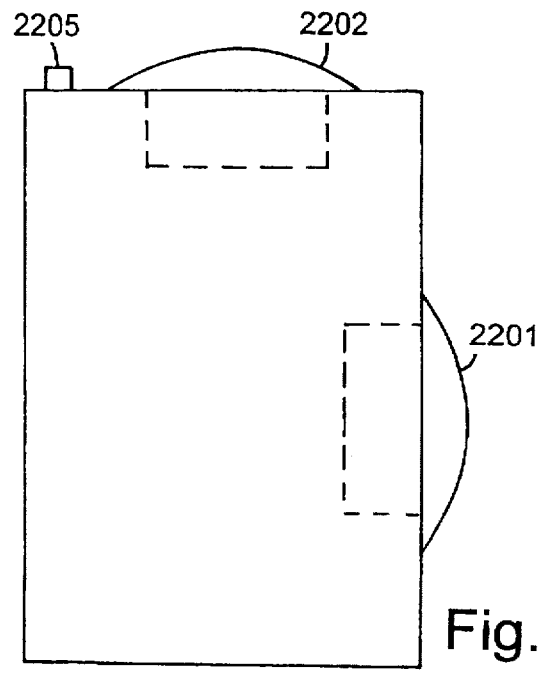
FIG. 19 is a pictorial view of a device having two palm buttons and an indicator light operated in accordance with the present invention.

Alternatively, the circuitry shown in FIG. 4 could be used. In another embodiment a method to prevent inadvertent actuations is to require a multi-step process. Referring to FIG. 19, a device is shown having a first palm button 2201, a second palm button 2202, and an indicator light 2205. Palm button 2201 has to be activated first and then button 2202 has to be activated within a 2 second time window before a desired actuation can occur. The 90 degree orientation of the two buttons makes it extremely difficult to accidently touch both with an arm and an elbow or other such physical combination. An added advantage is that the motion required to move the hand from button 2201 to button 2202 can provide some relief from fatigue in the forearm by the resulting muscle flexure that would otherwise not occur if the hand had to be kept near a single button for extended periods of time. A further redundancy can be achieved by requiring simultaneous operation of two such devices, one for each hand. This provides further safeguards against inadvertent actuations and forces the operator to have both hands in a desired safe location once a desired actuation occurs. A further option is to provide one or more LEDs 2205 or audible annunciators for visual or audible feedback to the operator. Specifically, in FIG. 19 the LED 2205 will come on when button 2201 has been successfully activated to cue the operator that it is time to move to button 2202. Where required a second LED with a different color than the first (yellow for the first LED and red for the second) can be provided to provide visual confirmation that the second button 2202 has been activated or that the required combination of the two buttons has been activated. Two different audible tone or sound generators could also be used in lieu of the LEDs to provide feedback to the operator. In industrial or other challenging settings, the housing is made of high strength polycarbonate (or other high strength non-metallic material) to meet high impact and vibration requirements, preferably NEMA 4. A further option is to provide lighting for the switches to allow operation in the dark.

Figure 20A:
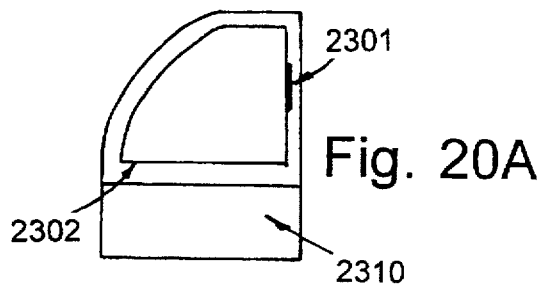
FIGS. 20A–C are pictorial views of another embodiment of the device shown in FIG. 19.
Figure 20B:
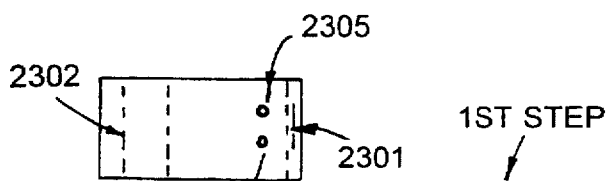
Figure 20C:
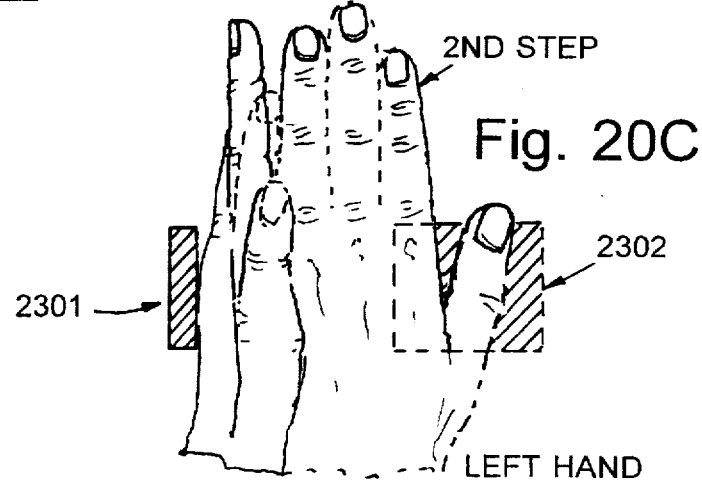

In a variation of the multi-step process, two touch plates within a housing (one vertical and one horizontal) are used to provide a two-step turn-on. Referring to FIGS. 20A-C, the first step to actuate the output relay 2310, is initiated when the operator inserts his hands and touches the vertical touch sensor 2301 with the dorsal side of the hands. A yellow LED 2304 on top of the device show the successful completion of the first step. The second step is to flip the hand over and touch the horizontal touch sensor 2302 with the palmar side of the hand. A red LED 2305 on top of the device shows the completion of the two step turn-on and activation of output relay 2310. The flipping action of the hand in the second step causes the forearm muscles to flex, thereby reducing stiffness and fatigue. Also, the hands, and arms can rest on the run bar until the machine cycle is complete. The second step of the two-step turn-on must occur within some predetermined time (for example 2 seconds) after the release of vertical touch sensor or the first step must be repeated. In this proposed embodiment, the second step provides an added stimulus and reduces operator errors due to mental and physical fatigue. The top cover prevents actuation of two devices by the use of one hand and elbow of the same arm, as required by ANSI Standard B11.19-1990. The enclosure must be a high strength polycarbonate module to meet the high impact and vibration requirements of the industry, preferably NEMA 4. In both embodiments, high frequency switching is used to desensitize the unit against moisture and contaminants that could generate a path between the button and grounded chassis. The palm button may be formed as the flat palm button shown in FIGS. 15A-C or as a dome-shaped palm button shown in FIG. 16. The button is made of a brass plate 1910 (1930) and can be covered with a plastic or glass 1925 (1933) cover or membrane to desensitize the unit even more against contaminants and other inadvertent actuation. The plastic cover 1925 (1933) acts as a dielectric and capacitance is varied as a function of the area of the plastic being touched. Therefore, if button is touched by finger, a much smaller series capacitance is generated as opposed to button being touched by the palm of a hand. This capacitance is placed in series with the capacitance of the body to ground when the button is touched. Since the capacitance of the body to ground is much larger than the capacitance generated by the button, the functionality of the unit is independent of the variations in body capacitance to ground from person to person. The other factor that needs to be considered here is body resistance. If the button is not covered with an insulator such as plastic, the unit would become sensitive to body resistance. Body resistance to ground, changes as a function of moisture in the work area, skin dryness, floor structure, and shoes. By using a plastic cover, the unit is made insensitive to variations of body resistance and capacitance. The shape of the button is also a factor in sensitivity. If the button is flat, less of the button area would be covered by the palm of the hand as opposed to a dome shape button that matches the contour of the palm. Therefore, if the button is dome-shaped, the unit can be even more desensitized against inadvertent operation.

By providing a large space for hand insertion and switch activation and a flat or dome shape button where the palm of the hand rests while machine cycle is in process, stress on the forearms is ergonomically reduced. The palm button of the present invention can be activated with or without gloves. The zero force palm button of the present invention may be used to activate electric, pneumatic, air clutch, and hydraulic equipment such as punch presses, molding machines, etc.

Figure 15A:
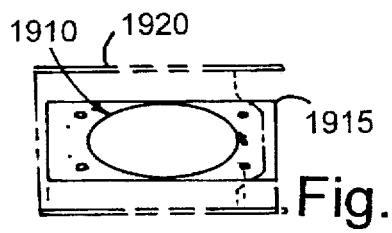
FIGS. 15A–C are top, side, and front views, respectively, of an example of a flat palm button constructed in accordance with the present invention.
Figure 15B:
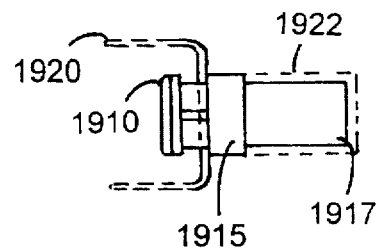
Figure 15C:
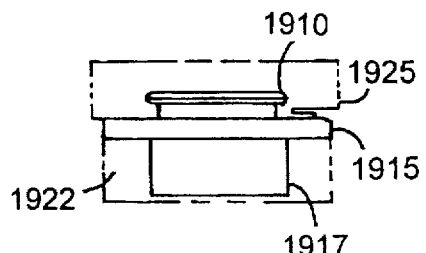
Figure 16:
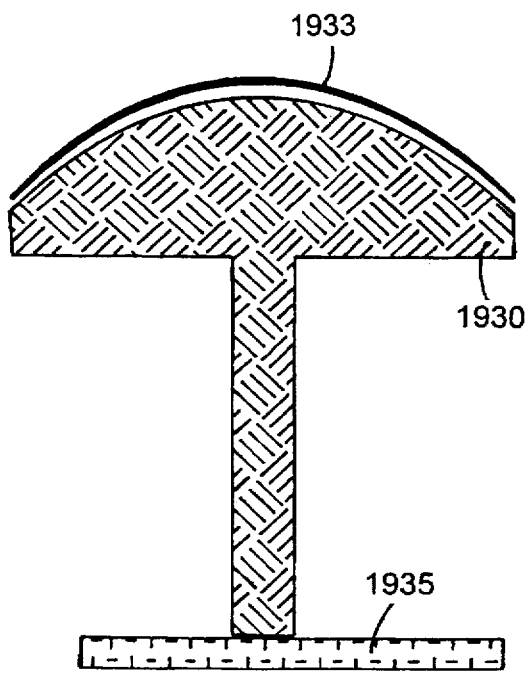
FIG. 16 is a cross-sectional view of an example of a dome-shaped palm button constructed in accordance with the present invention.

As shown in FIGS. 15A-C, the flat palm button may include a plastic housing 1917 having an optional metallic enclosure 1922 for surface mounting. The button also may include a flush mount surface 1915 and optional guarding 1920.

The circuit board 1935 used with the palm button of the present invention may be packaged on two printed circuit boards. One board for power and relay and the other for touch switches and relay drivers. The touch circuit on the touch switch board is interfaced to the button through a screw that also holds the button in place. The power/relay board is interfaced to the touch switch board through a three pin right angle connector. Wiring to the unit is done through a seven position terminal block on the power/relay board. The power/relay board is designed for 24 V DC input power and provides two double-throw relay contacts. However, it can be modified to accommodate different power inputs and switch outputs. For example, a transformer may be added to the power board so that the unit is powered 110VAC/220VAC instead of 24 V DC. Also, the relays may be replaced with other outputs such as digital or 4-20 mA outputs.

Figure 17:
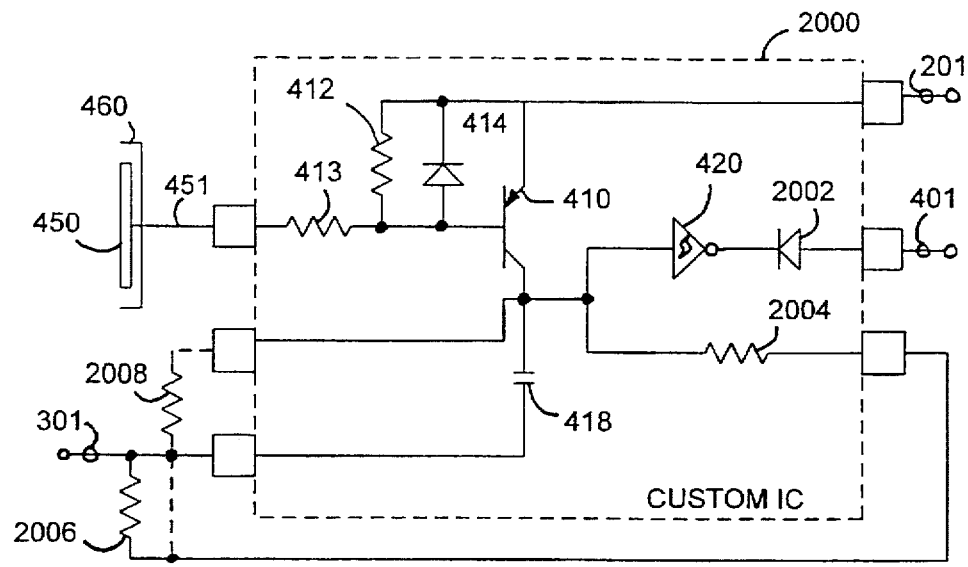
FIG. 17 is an electrical schematic of a touch circuit of the present invention implemented in a custom integrated circuit.

The touch circuit components can be integrated in a custom IC 2000, as shown in FIG. 17, to facilitate manufacturing and to reduce cost. Components 413, 412, 414, 410, 418, and 420 are similar to those of circuit 400 shown in FIG. 8. Preferably, resistor 2004 has a resistance of 470 kΩ and diode 2002 has characteristics similar to part no. 1N4148 available from LITEON. Resistors 2008 and 2006 are used to adjust the sensitivity. Diode 2002 at the output of 420, allows the IC to be used in applications where several touch circuit IC's are multiplexed.

Figure 18:
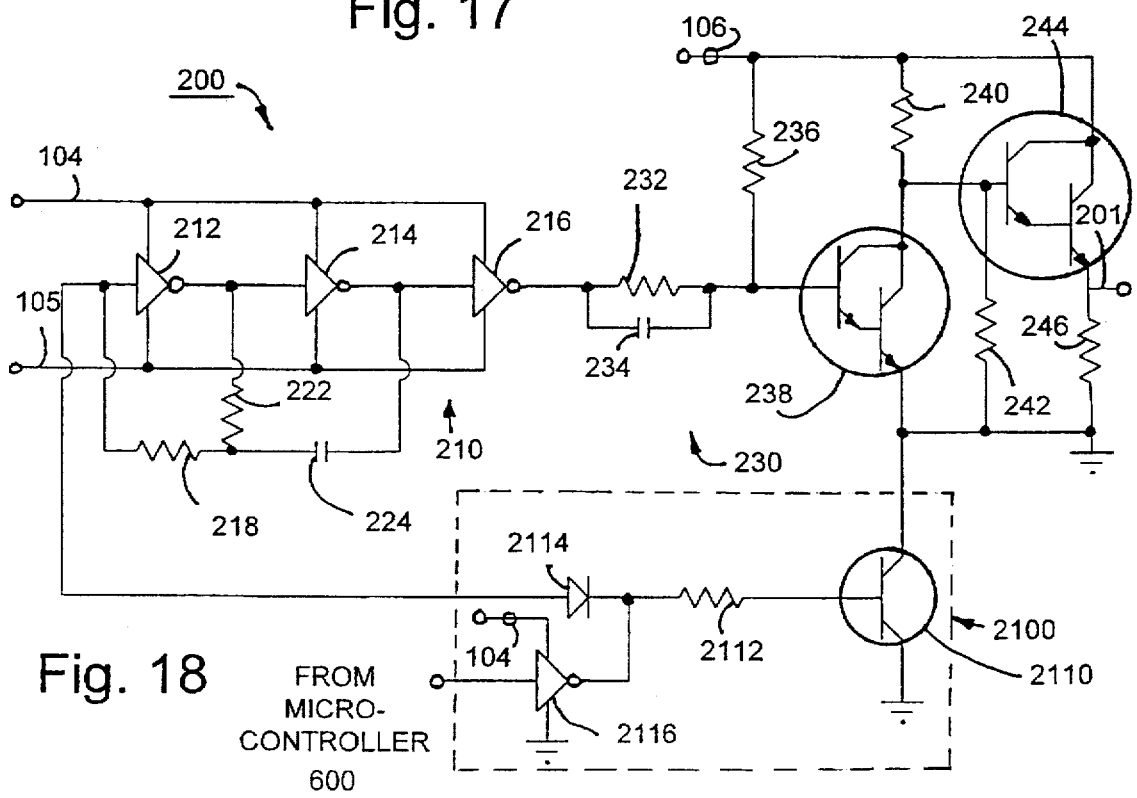
FIG. 18 is an electrical schematic of an oscillator having a sleeper circuit for use in the capacitive responsive electronic switching circuits of the present invention.

As shown in FIG. 18, a sleep circuit 2100 may be added to the oscillator circuit 200 (FIG. 6) to allow microcontroller 600 to turn off the oscillator circuit 200. The disabling of oscillator circuit 200 is done to reduce drainage of capacitor 126 in the regulator circuit 120 during brown outs. The circuit diagram shown in FIG. 18 is a modified version of circuit 200 in FIG. 6. During normal operation microcontroller 600 pulls the input of gate 2116 to ground and causes the output of gate 2116 to go high (power line 104). Therefore, transistor 2110 is biased on and oscillator 200 is functional. When in a sleep mode, microcontroller 600 sources the input to gate 2116 high and causes the output of gate 2116 to go low which turns off transistor 2110 and pulls the input of gate 212 low. Therefore, the oscillator will stop oscillating and drainage on capacitor 126 decreases considerably.

The above described embodiments were chosen for purposes of describing but one application of the present invention. It will be understood by those who practice the invention and by those skilled in the art, that various modifications and improvements may be made to the invention without departing from the spirit or scope of the invention as defined by the appended claims.

The embodiments of the invention in which an exclusive property or privilege is claimed are defined as follows:

1. A capacitive responsive electronic switching circuit comprising:

an oscillator providing a periodic output signal having a frequency of 50 kHz or greater;

an input touch terminal having a dielectric cover defining an area for an operator to provide an input by proximity and touch, an operator's body capacitance to ground as sensed through said input touch terminal varying as a function of the area of said input touch terminal that is proximate the operator's body; and a detector circuit coupled to said oscillator for receiving said periodic output signal from said oscillator, and coupled to said input touch terminal, said detector circuit being responsive to signals from said oscillator and the presence of an operator's body capacitance to ground coupled to said touch terminal when proximal or touched by an operator to provide a control output signal, wherein said detector circuit includes means for generating said control signal when the sensed body capacitance to ground exceeds a threshold level in order to prevent unintended activation based upon an operator's inadvertent proximity and touch with said input touch terminal.

2. The switching circuit as defined in claim 1, wherein said oscillator provides a periodic output signal having a frequency of 800 kHz or greater.

3. The switching circuit as defined in claim 1 and further including a DC power supply for supplying power to said oscillator and a ground.

4. The switching circuit as defined in claim 1, wherein said periodic output signal provided by said oscillator is a square wave output signal, said oscillator includes a square wave generator for generating a square wave, and a plurality of active elements coupled to an output of said square wave generator to buffer and improve the shape of the square wave output therefrom.

5. The switching circuit as defined in claim 1, wherein said detector circuit includes a microcontroller and a charge pump circuit coupled between said input touch terminal and said microcontroller.

6. The switching circuit as defined in claim 1, wherein said detector circuit includes a microcontroller and a touch circuit coupled between said input touch terminal and said microcontroller.

7. The switching circuit as defined in claim 6 and further including a plurality of said input touch terminals and a plurality of said touch circuits respectively associated with said input touch terminals.

8. The switching circuit as defined in claim 7, wherein said microcontroller selectively applies said periodic output signals received from said oscillator to each of said touch circuits to separately activate each touch circuit.

9. A capacitive responsive electronic switching circuit comprising:

an oscillator providing a periodic output signal having a frequency of 50 kHz or greater;

an input touch terminal defining an area for an operator to provide an input by proximity and touch;

a detector circuit coupled to said oscillator for receiving said periodic output signal from said oscillator, and coupled to said input touch terminal, said detector circuit being responsive to signals from said oscillator and the presence of an operator's body capacitance to ground coupled to said touch terminal when proximal or touched by an operator to provide a control output signal; and a floating common generator coupled to said oscillator for receiving said square wave output signal, said floating common generator generating a floating common reference for said detector circuit that is set at a fixed voltage below and tracks the square wave output signal.

10. The switching circuit as defined in claim 9, wherein said detector circuit is powered by said square wave output signal provided by said oscillator and by said floating common reference provided by said floating common generator thereby increasing the sensitivity of said detector circuit to proximity and touching of said touch terminal by an operator's body.

11. The switching circuit as defined in claim 10, wherein said detector circuit includes a microcontroller and a charge pump circuit coupled between said input touch terminal and said microcontroller, by an operator's body, wherein said charge pump circuit includes at least one high speed diode coupled between said oscillator and said touch terminal, for enhancing a sensitivity at which said charge pump responds to sensed body capacitance at said touch terminal for higher frequencies.

12. A proximity and touch controlled switching circuit comprising:

an oscillator providing a square wave output signal having a frequency of 50 kHz or greater;

a touch terminal having a dielectric cover defining an input terminal for coupling to an operator's body capacitance to ground; and a charge pump circuit coupled to said oscillator for receiving said square wave output signal, and coupled to said touch terminal, said charge pump circuit having an output terminal that supplies an output signal having a voltage that varies when said touch terminal is proximal or touched by an operator's body, the voltage of said output signal varies as a function of the area of said touch terminal that is proximal or touched by an operator, wherein said charge pump circuit includes at least one high speed diode coupled between said oscillator and said touch terminal, for enhancing a sensitivity at which said charge pump responds to sensed body capacitance to ground at said touch terminal for higher frequencies.

13. The proximity and touch controlled circuit as defined in claim 12 and further including a DC power supply for supplying power to said oscillator and a ground.

14. The proximity and touch controlled circuit as defined in claim 12, wherein said oscillator includes a square wave generator for generating a square wave, and a plurality of active elements coupled to an output of said square wave generator to buffer and improve the shape of the square wave output therefrom.

15. The proximity and touch controlled circuit as defined in claim 12, wherein said oscillator provides a periodic output signal having a frequency of 800 kHz or greater.

16. A proximity and touch controlled switching circuit comprising:

an oscillator providing a square wave output signal having a frequency of 50 kHz or greater;

a touch terminal defining an input terminal for coupling to an operator's body capacitance to ground;

a charge pump circuit coupled to said oscillator for receiving said square wave output signal, and coupled to said touch terminal, said charge pump circuit having an output terminal that supplies an output signal having a voltage that varies when said touch terminal is proximal or touched by an operator's body; and a floating common generator coupled to said oscillator for receiving said square wave output signal, said floating common generator generating a floating common reference for said charge pump circuit that is set at a fixed voltage below and tracks said square wave output signal.

wherein said charge pump circuit includes at least one high speed diode coupled between said oscillator and said touch terminal, for enhancing a sensitivity at which said charge pump responds to sensed body capacitance to ground at said touch terminal for higher frequencies.

17. The proximity and touch controlled circuit as defined in claim 16, wherein said charge pump circuit is powered by said square wave output signal provided by said oscillator and by said floating common reference provided by said floating common generator thereby increasing the sensitivity of said charge pump circuit to proximity and touching of said touch terminal by an operator's body.

18. A capacitive responsive electronic switching circuit comprising:

an oscillator providing a periodic output signal having a predefined frequency;

a plurality of input touch terminals defining adjacent areas on a dielectric substrate for an operator to provide inputs by proximity and touch; and a detector circuit coupled to said oscillator for receiving said periodic output signal from said oscillator, and coupled to said input touch terminals, said detector circuit being responsive to signals from said oscillator and the presence of an operator's body capacitance to ground coupled said touch terminals when proximal or touched by an operator to provide a control output signal, wherein said predefined frequency of said oscillator is selected to decrease the impedance of said dielectric substrate relative to the impedance of any contaminate that may create an electrical on said dielectric substrate path between said adjacent areas, and wherein said detector circuit compares the sensed body capacitance to ground proximate an input touch terminal to a threshold level to prevent inadvertent generation of the control output signal.

19. The switching circuit as defined in claim 18, wherein said oscillator provides a periodic output signal having a frequency of 800 kHz or greater.

20. A capacitive responsive electronic switching circuit comprising:

an oscillator providing a periodic output signal having a predefined frequency;

a dome-shaped touch terminal defining an area for an operator to provide an input by proximity and touch, wherein the dome shape of the touch terminal is constructed to ergonomically fit the palm of a human hand; and a detector circuit coupled to said oscillator for receiving said periodic output signal from said oscillator, and coupled to said touch terminal, said detector circuit being responsive to signals from said oscillator and the presence of an operator's body capacitance to ground coupled to said touch terminal when proximal or touched by an operator to provide a control output signal, said detector circuit including means for discriminating between a proximity and touch of said dome-shaped touch terminal by the palm of a human hand and a proximity and touch by a human finger.

21. A capacitive responsive electronic switching circuit comprising:

an oscillator providing a periodic output signal having a predefined frequency;

a touch terminal defining an area for an operator to provide an input by proximity and touch; and a detector circuit coupled to said oscillator for receiving said periodic output signal from said oscillator, and coupled to said touch terminal, said detector circuit being responsive to signals from said oscillator and the presence of an operator's body capacitance to ground coupled to said touch terminal when proximal or touched by an operator to provide a control output signal, said detector circuit including discriminating means for discriminating between a proximity and touch of said touch terminal covering substantially all of said area of said touch terminal and a proximity and touch covering less than substantially all of said area of said touch terminal.

22. The switching circuit as defined in claim 21, wherein said touch terminal includes a dome-shaped dielectric cover.

23. The switching circuit as defined in claim 21, wherein said touch terminal includes a palm-sized dielectric cover.

24. The switching circuit as defined in claim 23, wherein said discriminating means determines that a proximity and touch of said touch terminal covers substantially all of said area of said touch terminal when said dielectric cover is proximal or touched with the palm of an operator's hand and determines that a proximity or touch covers less than substantially all of said area of said touch terminal when said dielectric cover is proximal or touched with one of an operator's fingers.

25. The switching circuit as defined in claim 21, wherein said discriminating means discriminates between a proximity and touch of said touch terminal covering substantially all of said area of said touch terminal and a proximity and touch covering less than substantially all of said area of said touch terminal based upon a sensed level of body capacitance to ground proximate said touch terminal.

26. The switching circuit as defined in claim 21, wherein said coupling of capacitance to ground occurs when an operator's body is proximate, but not touching, said touch terminal.

27. A capacitive responsive electronic switching circuit for a controlled device comprising:

an oscillator providing a periodic output signal having a predefined frequency;

first and second touch terminals defining areas for an operator to provide an input by proximity and touch; and a detector circuit coupled to said oscillator for receiving said periodic output signal from said oscillator, and coupled to said first and second touch terminals, said detector circuit being responsive to signals from said oscillator and the presence of an operator's body capacitance to ground coupled to said first and second touch terminals when proximal or touched by an operator to provide a control output signal for actuation of the controlled device, said detector circuit being configured to generate said control output signal when said an operator is proximal or touches said second touch terminal after the operator is proximal or touches said first touch terminal.

28. The capacitive responsive electronic switching circuit as defined in claim 27, wherein said detector circuit generates said control signal only when an operator is proximal or touches said second touch terminal within a predetermined time period after the operator is proximal or touches said first touch terminal.

29. The capacitive responsive electronic switching circuit as defined in claim 27, wherein said first and second touch terminals are adapted to be mounted on different surfaces of the controlled device.

30. The capacitive responsive electronic switching circuit as defined in claim 27, wherein said first and second touch terminals are adapted to be mounted on non-parallel planar surfaces of the controlled device.

31. The capacitive responsive electronic switching circuit as defined in claim 27, wherein said first and second touch terminals are adapted to be mounted on perpendicular planar surfaces of the controlled device.

32. The capacitive responsive electronic switching circuit as defined in claim 27 and further including an indicator for indicating when said detector circuit determines that an operator is proximal or touches said first touch terminal.

* * * * *

UNITED STATES PATENT AND TRADEMARK OFFICE
CERTIFICATE OF CORRECTION

PATENT NO. : 5,796,183
DATED : August 18, 1998
INVENTOR(S) : Byron Hourmand

It is certified that error appears in the above-identified patent and that said Letters Patent is hereby corrected as shown below:

Column 5, line 52, "such a" should be --such as--.

Column 9, line 31, before "water" insert --condensed--.

Column 14, line 35, "is" should be --as--.

Column 13, line 65, "it's" should be --its--.

Column 18, line 38, "references" should be --reference--.

Column 20, line 7, "it's" should be --its-- (both occurrences).

Column 20, line 9, "it's" should be --its--.

Column 20, line 10, "it's" should be --its-- (both occurrences).

Column 20, line 13, "it's" should be --its--.

Column 20, line 20, "it's" should be --its--.

Column 20, line 39, "it's" should be --its--.

Column 20, line 40, "it's" should be --its--.

Column 20, line 46, "it's" should be --its--.

Column 20, line 47, "it's" should be --its--.

UNITED STATES PATENT AND TRADEMARK OFFICE
CERTIFICATE OF CORRECTION

PATENT NO. : 5,796,183
DATED : August 18, 1998
INVENTOR(S) : Byron Hourmand

It is certified that error appears in the above-identified patent and that said Letters Patent is hereby corrected as shown below:

Column 21, line 8, "it's" should be --its--.

Column 21, line 9, "it's" should be --its--.

Column 21, line 15, "it's" should be --its--.

Column 21, line 42, "it's" should be --its--.

Column 21, line 46, "it's" should be --its--.

Column 21, line 47, "it's" should be --its--.

Column 21, line 56, "it's" should be --its--.

Column 22, line 8, "it's" should be --its--.

Column 22, line 13, "schmitt" should be --Schmitt--.

Column 26, lines 22-27, after "microcontroller." delete "by an operator's body . . . higher frequencies."

UNITED STATES PATENT AND TRADEMARK OFFICE
CERTIFICATE OF CORRECTION

PATENT NO. : 5,796,183
DATED : August 18, 1998
INVENTOR(S) : Byron Hourmand

Page 3 of 3

It is certified that error appears in the above-identified patent and that said Letters Patent is hereby corrected as shown below:

Column 27, line 44, after "electrical" insert --path--.

Column 27, line 45, delete "path".

Column 29, line 1, after "when" delete "said".

Signed and Sealed this

Eleventh Day of May, 1999

*Attest:*

Q. TODD DICKINSON

*Attesting Officer*     *Acting Commissioner of Patents and Trademarks*

UNITED STATES PATENT AND TRADEMARK OFFICE
CERTIFICATE OF CORRECTION

| | |
|---|---|
| PATENT NO. | : 5,796,183 |
| APPLICATION NO. | : 08/601268 |
| DATED | : August 18, 1998 |
| INVENTOR(S) | : Byron Hourmand et al. |

Page 1 of 1

It is certified that error appears in the above-identified patent and that said Letters Patent is hereby corrected as shown below:

Title Page, Item (75) Inventor, should read --(75) Inventors: Byron Hourmand, Hersey, MI (US); John M. Washeleski, Cadillac, MI (US); Stephen R. W. Cooper, Fowlerville, MI (US)--.

Signed and Sealed this
Eleventh Day of October, 2011

David J. Kappos
*Director of the United States Patent and Trademark Office*

(12) EX PARTE REEXAMINATION CERTIFICATE (9614th)
United States Patent
Hourmand et al.

(10) Number: US 5,796,183 C1
(45) Certificate Issued: Apr. 29, 2013

(54) CAPACITIVE RESPONSIVE ELECTRONIC SWITCHING CIRCUIT

(75) Inventors: Byron Hourmand, Hersey, MI (US); John M. Washeleski, Cadillac, MI (US); Stephen R. W. Cooper, Fowlerville, MI (US)

(73) Assignee: Nartron Corporation, Reed City, MI (US)

Reexamination Request:
No. 90/012,439, Aug. 17, 2012

Reexamination Certificate for:
Patent No.: 5,796,183
Issued: Aug. 18, 1998
Appl. No.: 08/601,268
Filed: Jan. 31, 1996

Certificate of Correction issued May 11, 1999
Certificate of Correction issued Oct. 11, 2011

(51) Int. Cl.
*H03K 17/96* (2006.01)
*H03K 17/94* (2006.01)

(52) U.S. Cl.
USPC ............ 307/116; 307/125; 307/139; 361/181

(58) Field of Classification Search
None
See application file for complete search history.

(56) References Cited

To view the complete listing of prior art documents cited during the proceeding for Reexamination Control Number 90/012,439, please refer to the USPTO's public Patent Application Information Retrieval (PAIR) system under the Display References tab.

*Primary Examiner* — Linh M. Nguyen

(57) ABSTRACT

A capacitive responsive electronic switching circuit comprises an oscillator providing a periodic output signal having a frequency of 50 kHz or greater, an input touch terminal defining an area for an operator provide an input by proximity and touch, and a detector circuit coupled to the oscillator for receiving the periodic output signal from the oscillator, and coupled to the input touch terminal. The detector circuit being responsive to signals from the oscillator and the presence of an operator's body capacitance to ground coupled to the touch terminal when in proximity or touched by an operator to provide a control output signal. Preferably, the oscillator provides a periodic output signal having a frequency of 800 kHz or greater. An array of touch terminals may be provided in close proximity due to the reduction in crosstalk that may result from contaminants by utilizing an oscillator outputting a signal having a frequency of 50 kHz or greater.

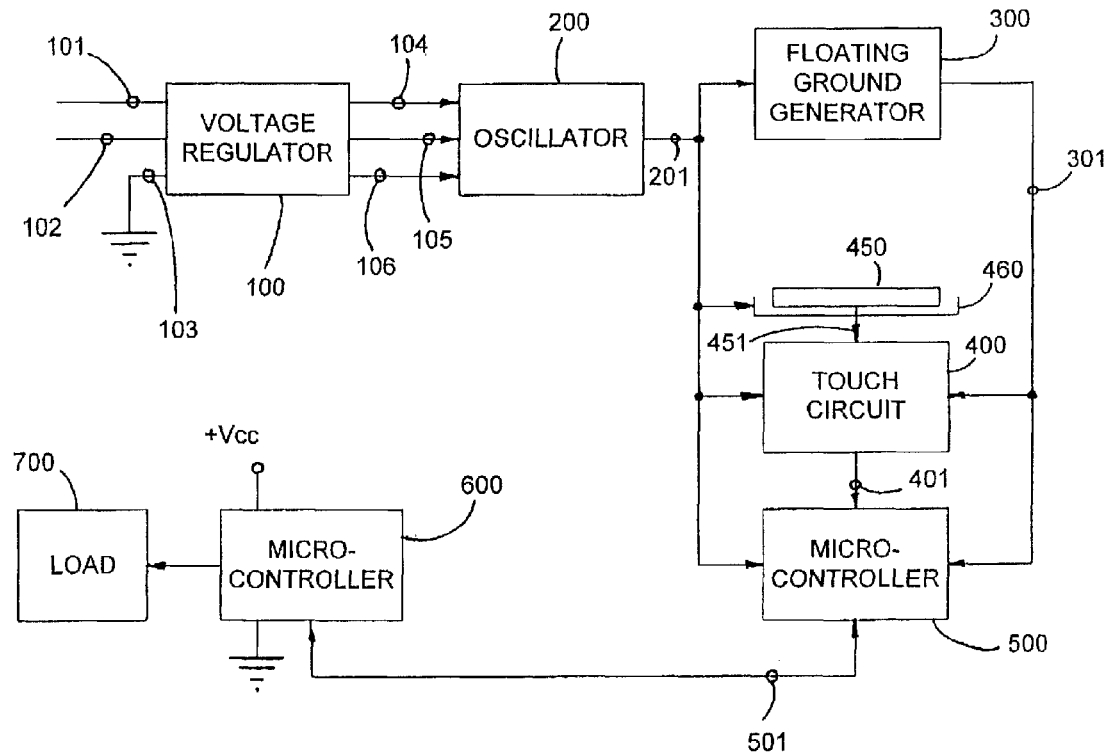

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 18, 27, 28 and 32 are determined to be patentable as amended.

New claims 33-39 are added and determined to be patentable.

Claims 1-17, 19-26 and 29-31 were not reexamined.

18. A capacitive responsive electronic switching circuit comprising:
an oscillator providing a periodic output signal having a predefined frequency;
*a microcontroller using the periodic output signal from the oscillator, the microcontroller selectively providing signal output frequencies to a plurality of small sized input touch terminals of a keypad;*
[a] *the* plurality of *small sized* input touch terminals defining adjacent areas on a dielectric substrate for an operator to provide inputs by proximity and touch; and
a detector circuit coupled to said oscillator for receiving said periodic output signal from said oscillator, and coupled to said input touch terminals, said detector circuit being responsive to signals from said oscillator *via said microcontroller* and [the] *a* presence of an operator's body capacitance to ground coupled *to* said touch terminals when proximal or touched by [an] *the* operator to provide a control output signal,
wherein said predefined frequency of said oscillator [is] *and said signal output frequencies are* selected to decrease [the] *a first* impedance of said dielectric substrate relative to [the] *a second* impedance of any contaminate that may create an electrical path on said dielectric substrate between said adjacent areas *defined by the plurality of small sized input touch terminals*, and wherein said detector circuit compares [the] *a* sensed body capacitance *change* to ground proximate an input touch terminal to a threshold level to prevent inadvertent generation of the control output signal.

27. A capacitive responsive electronic switching circuit for a controlled *keypad* device comprising:
an oscillator providing a periodic output signal having a predefined frequency;
*a microcontroller using the periodic output signal from the oscillator, the microcontroller selectively providing signal output frequencies to a closely spaced array of input touch terminals of a keypad, the input touch terminals comprising first and second input touch terminals;*
*the* first and second *input* touch terminals defining areas for an operator to provide an input by proximity and touch; and
a detector circuit coupled to said oscillator for receiving said periodic output signal from said oscillator, and coupled to said first and second touch terminals, said detector circuit being responsive to signals from said oscillator *via said microcontroller* and [the] *a* presence of an operator's body capacitance to ground coupled to said first and second touch terminals when proximal or touched by [an] *the* operator to provide a control output signal for actuation of the controlled *keypad* device, said detector circuit being configured to generate said control output signal when [an] *the* operator is proximal or touches said second touch terminal after the operator is proximal or touches said first touch terminal.

28. The capacitive responsive electronic switching circuit as defined in claim 27, wherein said detector circuit generates said control signal only when [an] *the* operator is proximal or touches said second touch terminal within a predetermined time period after the operator is proximal or touches said first touch terminal.

32. The capacitive responsive electronic switching circuit as defined in claim 27 and further including an indicator for indicating when said detector circuit determines that [an] *the* operator is proximal or touches said first touch terminal.

*33. The capacitive responsive electronic switching circuit as defined in claim 18, further comprising wherein said detector circuit compares the sensed body capacitance change caused by the body capacitance decreasing an input touch terminal signal on the detector to ground when proximate to the input touch terminal to a second threshold level to generate the control output signal.*

*34. The capacitive responsive electronic switching circuit as defined in claim 18, further comprising wherein said detector circuit compares the sensed body capacitance change caused by the body capacitance decreasing an input touch terminal signal amplitude on the detector to ground when proximate to the input touch terminal to a second threshold level to generate the control output signal.*

*35. The capacitive responsive electronic switching circuit as defined in claim 27, wherein when the second touch terminal is not touched on its defining area by the operator to provide input, the control output signal is prevented.*

*36. The capacitive responsive electronic switching circuit as defined in claim 27 and further including an indicator for indicating when said detector circuit determines that the operator is proximal or touches said second touch terminal.*

*37. A capacitive responsive electronic switching circuit for a controlled device comprising:*
*an oscillator providing a periodic output signal having a predefined frequency, wherein an oscillator voltage is greater than a supply voltage;*
*a microcontroller using the periodic output signal from the oscillator, the microcontroller selectively providing signal output frequencies to a closely spaced array of input touch terminals of a keypad, the input touch terminals comprising first and second input touch terminals;*
*the first and second touch terminals defining areas for an operator to provide an input by proximity and touch; and*
*a detector circuit coupled to said oscillator for receiving said periodic output signal from said oscillator, and coupled to said first and second touch terminals, said detector circuit being responsive to signals from said oscillator via said microcontroller and a presence of an operator's body capacitance to ground coupled to said first and second touch terminals when proximal or touched by the operator to provide a control output signal for actuation of the controlled device, said detector circuit being configured to generate said control output signal when the operator is proximal or touches said second touch terminal after the operator is proximal or touches said first touch terminal.*

38. The capacitive responsive electronic switching circuit as defined in claim 37, wherein feedback to the operator is provided by an indicator activated by the microcontroller after the operator touches the second touch terminal.

39. The capacitive responsive electronic switching circuit as defined in claim 37,
- wherein said detector circuit compares a sensed body capacitance change caused by the body capacitance decreasing a second touch terminal signal on the detector to ground when proximate to the second touch terminal to a threshold level to generate the control output signal, and
- wherein feedback to the operator is provided by an indicator activated by the microcontroller after the operator touches the second touch terminal.

\* \* \* \* \*

US005796183C2

(12) EX PARTE REEXAMINATION CERTIFICATE (10211th)

United States Patent
Hourmand et al.

(10) Number: US 5,796,183 C2
(45) Certificate Issued: Jun. 27, 2014

(54) CAPACITIVE RESPONSIVE ELECTRONIC SWITCHING CIRCUIT

(75) Inventors: Byron Hourmand, Hersey, MI (US); John M. Washeleski, Cadillac, MI (US); Stephen R. W. Cooper, Fowlerville, MI (US)

(73) Assignee: Nartron Corporation, Reed City, MI (US)

Reexamination Request:
No. 90/013,106, Dec. 24, 2013

Reexamination Certificate for:
Patent No.: 5,796,183
Issued: Aug. 18, 1998
Appl. No.: 08/601,268
Filed: Jan. 31, 1996

Reexamination Certificate C1 5,796,183 issued Apr. 29, 2013

Certificate of Correction issued May 11, 1999
Certificate of Correction issued Oct. 11, 2011

(51) Int. Cl.
*H03K 17/96* (2006.01)
*H03K 17/94* (2006.01)

(52) U.S. Cl.
USPC ........... 307/116; 307/125; 307/139; 307/140; 307/112; 307/113; 361/181

(58) Field of Classification Search
USPC ......... 307/112, 113, 116, 125, 139, 140, 157; 361/181
See application file for complete search history.

(56) References Cited

To view the complete listing of prior art documents cited during the proceeding for Reexamination Control Number 90/013,106, please refer to the USPTO's public Patent Application Information Retrieval (PAIR) system under the Display References tab.

*Primary Examiner* — Henry N Tran

(57) ABSTRACT

A capacitive responsive electronic switching circuit comprises an oscillator providing a periodic output signal having a frequency of 50 kHz or greater, an input touch terminal defining an area for an operator provide an input by proximity and touch, and a detector circuit coupled to the oscillator for receiving the periodic output signal from the oscillator, and coupled to the input touch terminal. The detector circuit being responsive to signals from the oscillator and the presence of an operator's body capacitance to ground coupled to the touch terminal when in proximity or touched by an operator to provide a control output signal. Preferably, the oscillator provides a periodic output signal having a frequency of 800 kHz or greater. An array of touch terminals may be provided in close proximity due to the reduction in crosstalk that may result from contaminants by utilizing an oscillator outputting a signal having a frequency of 50 kHz or greater.

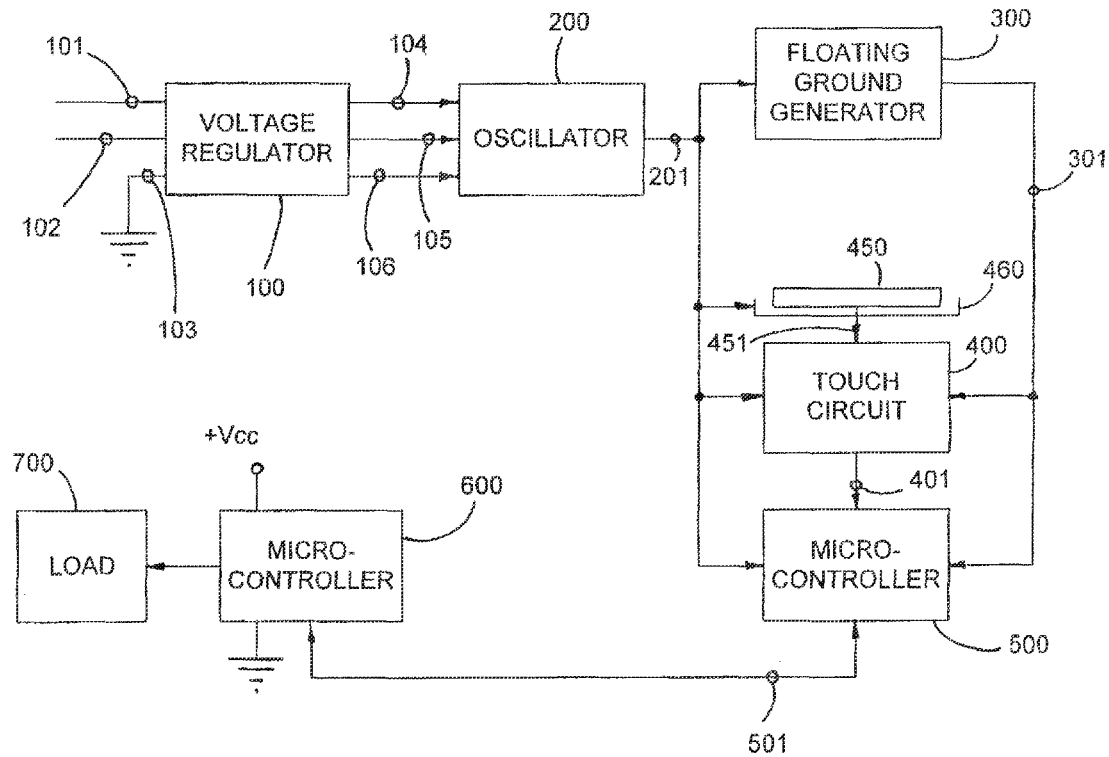

US 5,796,183 C2

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 18, 27 and 35 are cancelled.

New claims 40-117 are added and determined to be patentable.

Claims 1-17, 19-26, 28-34 and 36-39 were not reexamined.

*40. A capacitive responsive electronic switching circuit comprising:*
  *an oscillator providing a periodic output signal having a predefined frequency;*
  *a microcontroller using the periodic output signal from the oscillator, the microcontroller selectively providing signal output frequencies to a plurality of small sized input touch terminals of a keypad, wherein the selectively providing comprises the microcontroller selectively providing a signal output frequency to each row of the plurality of small sized input touch terminals of the keypad;*
  *the plurality of small sized input touch terminals defining adjacent areas on a dielectric substrate for an operator to provide inputs by proximity and touch; and*
  *a detector circuit coupled to said oscillator for receiving said periodic output signal from said oscillator, and coupled to said input touch terminals, said detector circuit being responsive to signals from said oscillator via said microcontroller and a presence of an operator's body capacitance to ground coupled to said touch terminals when proximal or touched by the operator to provide a control output signal,*
  *wherein said predefined frequency of said oscillator and said signal output frequencies are selected to decrease a first impedance of said dielectric substrate relative to a second impedance of any contaminate that may create an electrical path on said dielectric substrate between said adjacent areas defined by the plurality of small sized input touch terminals, and wherein said detector circuit compares a sensed body capacitance change to ground proximate an input touch terminal to a threshold level to prevent inadvertent generation of the control output signal.*

*41. The capacitive responsive electronic switching circuit as defined in claim 40, wherein each signal output frequency selectively provided to each row of the plurality of small sized input touch terminals of the keypad is selected from a plurality of Hertz values.*

*42. The capacitive responsive electronic switching circuit as defined in claim 41, wherein the plurality of Hertz values comprises Hertz values greater than 50 kHz.*

*43. The capacitive responsive electronic switching circuit as defined in claim 41, wherein the plurality of Hertz values comprises Hertz values greater than 100 kHz.*

*44. The capacitive responsive electronic switching circuit as defined in claim 41, wherein the plurality of Hertz values comprises Hertz values greater than 800 kHz.*

*45. The capacitive responsive electronic switching circuit as defined in claim 40, wherein each signal output frequency selectively provided to each row of the plurality of small sized input touch terminals of the keypad has a same Hertz value.*

*46. The capacitive responsive switching circuit as defined in claim 40, wherein said oscillator provides a periodic output signal having a frequency of 800 kHz or greater.*

*47. The capacitive responsive electronic switching circuit as defined in claim 40, wherein the sensed body capacitance change to ground proximate the input touch terminal is caused by the operator's body capacitance decreasing an input touch terminal signal on the detector circuit, and wherein the sensed body capacitance change to ground is compared to a second threshold level to generate the control output signal.*

*48. The capacitive responsive electronic switching circuit as defined in claim 40, wherein the sensed body capacitance change to ground proximate the input touch terminal is caused by the operator's body capacitance decreasing an input touch terminal signal amplitude on the detector circuit, and wherein the sensed body capacitance change to ground is compared to a second threshold level to generate the control output signal.*

*49. The capacitive responsive electronic switching circuit as defined in claim 40, wherein the detector circuit comprises a plurality of touch circuits, and wherein the microcontroller selectively provides the signal output frequencies to the plurality of small sized input touch terminals of the keypad via the plurality of touch circuits.*

*50. A capacitive responsive electronic switching circuit comprising:*
  *an oscillator providing a periodic output signal having a predefined frequency;*
  *a microcontroller using the periodic output signal from the oscillator, the microcontroller selectively providing signal output frequencies directly to a plurality of small sized input touch terminals of a keypad;*
  *the plurality of small sized input touch terminals defining adjacent areas on a dielectric substrate for an operator to provide inputs by proximity and touch; and*
  *a detector circuit coupled to said oscillator for receiving said periodic output signal from said oscillator, and coupled to said input touch terminals, said detector circuit being responsive to signals from said oscillator via said microcontroller and a presence of an operator's body capacitance to ground coupled to said touch terminals when proximal or touched by the operator to provide a control output signal,*
  *wherein said predefined frequency of said oscillator and said signal output frequencies are selected to decrease a first impedance of said dielectric substrate relative to a second impedance of any contaminate that may create an electrical path on said dielectric substrate between said adjacent areas defined by the plurality of small sized input touch terminals, and wherein said detector circuit compares a sensed body capacitance change to ground proximate an input touch terminal to a threshold level to prevent inadvertent generation of the control output signal.*

*51. The capacitive responsive electronic switching circuit as defined in claim 50, wherein the sensed body capacitance change to ground proximate the input touch terminal is caused by the operator's body capacitance decreasing an input touch terminal signal on the detector circuit, and* wherein the sensed body capacitance change to ground is compared to a second threshold level to generate the control output signal.

52. The capacitive responsive electronic switching circuit as defined in claim 50, wherein the sensed body capacitance change to ground proximate the input touch terminal is caused by the operator's body capacitance decreasing an input touch terminal signal amplitude on the detector circuit, and wherein the sensed body capacitance change to ground is compared to a second threshold level to generate the control output signal.

53. The capacitive responsive electronic switching circuit as defined in claim 50, wherein a peak voltage of the signal output frequencies is greater than a supply voltage.

54. The capacitive responsive electronic switching circuit as defined in claim 53, wherein the supply voltage is a battery supply voltage.

55. The capacitive responsive electronic switching circuit as defined in claim 53, wherein the supply voltage is a voltage regulator supply voltage.

56. The capacitive responsive electronic switching circuit as defined in claim 50, wherein the signal output frequencies have a same Hertz value.

57. The capacitive responsive electronic switching circuit as defined in claim 50, wherein each signal output frequency is selected from a plurality of Hertz values.

58. The capacitive responsive electronic switching circuit as defined in claim 57, wherein the plurality of Hertz values comprises Hertz values greater than 50 kHz.

59. The capacitive responsive electronic switching circuit as defined in claim 57, wherein the plurality of Hertz values comprises Hertz values greater than 100 kHz.

60. The capacitive responsive electronic switching circuit as defined in claim 57, wherein the plurality of Hertz values comprises Hertz values greater than 800 kHz.

61. A capacitive responsive electronic switching circuit comprising:
an oscillator providing a periodic output signal having a predefined frequency;
a microcontroller using the periodic output signal from the oscillator, the microcontroller selectively providing signal output frequencies to a plurality of small sized input touch terminals of a keypad, wherein the selectively providing comprises the microcontroller selectively providing a signal output frequency to each row of the plurality of small sized input touch terminals of the keypad, and wherein a peak voltage of the signal output frequencies is greater than a supply voltage;
the plurality of small sized input touch terminals defining adjacent areas on a dielectric substrate for an operator to provide inputs by proximity and touch; and
a detector circuit coupled to said oscillator for receiving said periodic output signal from said oscillator, and coupled to said input touch terminals, said detector circuit being responsive to signals from said oscillator via said microcontroller and a presence of an operator's body capacitance to ground coupled to said touch terminals when proximal or touched by the operator to provide a control output signal,
wherein said predefined frequency of said oscillator and said signal output frequencies are selected to decrease a first impedance of said dielectric substrate relative to a second impedance of any contaminate that may create an electrical path on said dielectric substrate between said adjacent areas defined by the plurality of small sized input touch terminals, and wherein said detector circuit compares a sensed body capacitance change to ground proximate an input touch terminal to a threshold level to prevent inadvertent generation of the control output signal.

62. The capacitive responsive electronic switching circuit as defined in claim 61, wherein the sensed body capacitance change to ground proximate the input touch terminal is caused by the operator's body capacitance decreasing an input touch terminal signal on the detector circuit, and wherein the sensed body capacitance change to ground is compared to a second threshold level to generate the control output signal.

63. The capacitive responsive electronic switching circuit as defined in claim 61, wherein the sensed body capacitance change to ground proximate the input touch terminal is caused by the operator's body capacitance decreasing an input touch terminal signal amplitude on the detector circuit, and wherein the sensed body capacitance change to ground is compared to a second threshold level to generate the control output signal.

64. The capacitive responsive electronic switching circuit as defined in claim 61, wherein the supply voltage is a battery supply voltage.

65. The capacitive responsive electronic switching circuit as defined in claim 61, wherein the supply voltage is a voltage regulator supply voltage.

66. The capacitive responsive electronic switching circuit as defined in claim 61, wherein each signal output frequency selectively provided to each row of the plurality of small sized input touch terminals of the keypad has a same Hertz value.

67. The capacitive responsive electronic switching circuit as defined in claim 61, wherein each signal output frequency selectively provided to each row of the plurality of small sized input touch terminals of the keypad is selected from a plurality of Hertz values.

68. The capacitive responsive electronic switching circuit as defined in claim 67, wherein the plurality of Hertz values comprises Hertz values greater than 50 kHz.

69. The capacitive responsive electronic switching circuit as defined in claim 67, wherein the plurality of Hertz values comprises Hertz values greater than 100 kHz.

70. The capacitive responsive electronic switching circuit as defined in claim 67, wherein the plurality of Hertz values comprises Hertz values greater than 800 kHz.

71. A capacitive responsive electronic switching circuit for a controlled keypad device comprising:
an oscillator providing a periodic output signal having a predefined frequency;
a microcontroller using the periodic output signal from the oscillator, the microcontroller selectively providing signal output frequencies directly to a closely spaced array of input touch terminals of a keypad, the input touch terminals comprising first and second input touch terminals;
the first and second input touch terminals defining areas for an operator to provide an input by proximity and touch; and
a detector circuit coupled to said oscillator for receiving said periodic output signal from said oscillator, and coupled to said first and second touch terminals, said detector circuit being responsive to signals from said oscillator via said microcontroller and a presence of an operator's body capacitance to ground coupled to said first and second touch terminals when proximal or touched by the operator to provide a control output signal for actuation of the controlled keypad device, said detector circuit being configured to generate said control output signal when the operator is proximal or touches said second touch terminal after the operator is proximal or touches said first touch terminal.

72. The capacitive responsive electronic switching circuit as defined in claim 71, wherein the detector circuit is configured to inhibit the control output signal unless the operator is proximal or touches said second touch terminal after the operator is proximal or touches said first touch terminal.

73. The capacitive responsive electronic switching circuit as defined in claim 71, wherein the signal output frequencies have a same Hertz value.

74. The capacitive responsive electronic switching circuit as defined in claim 71, wherein each signal output frequency is selected from a plurality of Hertz values.

75. The capacitive responsive electronic switching circuit as defined in claim 74, wherein the plurality of Hertz values comprises Hertz values greater than 50 kHz.

76. The capacitive responsive electronic switching circuit as defined in claim 74, wherein the plurality of Hertz values comprises Hertz values greater than 100 kHz.

77. The capacitive responsive electronic switching circuit as defined in claim 74, wherein the plurality of Hertz values comprises Hertz values greater than 800 kHz.

78. The capacitive responsive electronic switching circuit as defined in claim 71, wherein said detector circuit is configured to generate said control output signal only when the operator is proximal or touches said second touch terminal within a predetermined time period after the operator is proximal or touches said first touch terminal.

79. The capacitive responsive electronic switching circuit as defined in claim 71, further comprising an indicator for indicating the detector circuit has determined that the operator is proximal or touches said second touch terminal.

80. The capacitive responsive electronic switching circuit as defined in claim 71, wherein a peak voltage of the signal output frequencies is greater than a supply voltage.

81. The capacitive responsive electronic switching circuit as defined in claim 80, wherein the supply voltage is a battery supply voltage.

82. The capacitive responsive electronic switching circuit as defined in claim 80, wherein the supply voltage is a voltage regulator supply voltage.

83. A capacitive responsive electronic switching circuit for a controlled keypad device comprising:
   an oscillator providing a periodic output signal having a predefined frequency;
   a microcontroller using the periodic output signal from the oscillator, the microcontroller selectively providing signal output frequencies to a closely spaced array of input touch terminals of a keypad, the input touch terminals comprising first and second input touch terminals, wherein a peak voltage of the signal output frequencies is greater than a supply voltage;
   the first and second input touch terminals defining areas for an operator to provide an input by proximity and touch; and
   a detector circuit coupled to said oscillator for receiving said periodic output signal from said oscillator, and coupled to said first and second touch terminals, said detector circuit being responsive to signals from said oscillator via said microcontroller and a presence of an operator's body capacitance to ground coupled to said first and second touch terminals when proximal or touched by the operator to provide a control output signal for actuation of the controlled keypad device, said detector circuit being configured to generate said control output signal when the operator is proximal or touches said second touch terminal after the operator is proximal or touches said first touch terminal.

84. The capacitive responsive electronic switching circuit as defined in claim 83, wherein the detector circuit is configured to inhibit the control output signal unless the operator is proximal or touches said second touch terminal after the operator is proximal or touches said first touch terminal.

85. The capacitive responsive electronic switching circuit as defined in claim 83, wherein the signal output frequencies have a same Hertz value.

86. The capacitive responsive electronic switching circuit as defined in claim 83, wherein each signal output frequency is selected from a plurality of Hertz values.

87. The capacitive responsive electronic switching circuit as defined in claim 86, wherein the plurality of Hertz values comprises Hertz values greater than 50 kHz.

88. The capacitive responsive electronic switching circuit as defined in claim 86, wherein the plurality of Hertz values comprises Hertz values greater than 100 kHz.

89. The capacitive responsive electronic switching circuit as defined in claim 86, wherein the plurality of Hertz values comprises Hertz values greater than 800 kHz.

90. The capacitive responsive electronic switching circuit as defined in claim 83, wherein the supply voltage is a battery supply voltage.

91. The capacitive responsive electronic switching circuit as defined in claim 83, wherein the supply voltage is a voltage regulator supply voltage.

92. The capacitive responsive electronic switching circuit as defined in claim 83, wherein said detector circuit is configured to generate said control output signal only when the operator is proximal or touches said second touch terminal within a predetermined time period after the operator is proximal or touches said first touch terminal.

93. The capacitive responsive electronic switching circuit as defined in claim 83, further comprising an indicator for indicating the detector circuit has determined that the operator is proximal or touches said second touch terminal.

94. A capacitive responsive electronic switching circuit for a controlled keypad device comprising:
   an oscillator providing a periodic output signal having a predefined frequency;
   a microcontroller using the periodic output signal from the oscillator, the microcontroller selectively providing signal output frequencies to a closely spaced array of input touch terminals of a keypad, wherein the selectively providing comprises the microcontroller selectively providing a signal output frequency to each row of the closely spaced array of input touch terminals of the keypad, the input touch terminals comprising first and second input touch terminals, and wherein a peak voltage of the signal output frequencies is greater than a supply voltage;
   the first and second input touch terminals defining areas for an operator to provide an input by proximity and touch; and
   a detector circuit coupled to said oscillator for receiving said periodic output signal from said oscillator, and coupled to said first and second touch terminals, said detector circuit being responsive to signals from said oscillator via said microcontroller and a presence of an operator's body capacitance to ground coupled to said first and second touch terminals when proximal or touched by the operator to provide a control output signal for actuation of the controlled keypad device, said detector circuit being configured to generate said control output signal when the operator is proximal or touches said second touch terminal after the operator is proximal or touches said first touch terminal.

95. The capacitive responsive electronic switching circuit as defined in claim 94, wherein the detector circuit is configured to inhibit the control output signal unless the operator is proximal or touches said second touch terminal after the operator is proximal or touches said first touch terminal.

96. The capacitive responsive electronic switching circuit as defined in claim 94, wherein each signal output frequency selectively provided to each row of the closely spaced array of input touch terminals of the keypad has a same Hertz value.

97. The capacitive responsive electronic switching circuit as defined in claim 94, wherein each signal output frequency selectively provided to each row of the closely spaced array of input touch terminals of the keypad is selected from a plurality of Hertz values.

98. The capacitive responsive electronic switching circuit as defined in claim 97, wherein the plurality of Hertz values comprises Hertz values greater than 50 kHz.

99. The capacitive responsive electronic switching circuit as defined in claim 97, wherein the plurality of Hertz values comprises Hertz values greater than 100 kHz.

100. The capacitive responsive electronic switching circuit as defined in claim 97, wherein the plurality of Hertz values comprises Hertz values greater than 800 kHz.

101. The capacitive responsive electronic switching circuit as defined in claim 94, wherein the supply voltage is a battery supply voltage.

102. The capacitive responsive electronic switching circuit as defined in claim 94, wherein the supply voltage is a voltage regulator supply voltage.

103. The capacitive responsive electronic switching circuit as defined in claim 94, wherein said detector circuit is configured to generate said control output signal only when the operator is proximal or touches said second touch terminal within a predetermined time period after the operator is proximal or touches said first touch terminal.

104. The capacitive responsive electronic switching circuit as defined in claim 94, further comprising an indicator for indicating the detector circuit has determined that the operator is proximal or touches said second touch terminal.

105. A capacitive responsive electronic switching circuit for a controlled keypad device comprising:
an oscillator providing a periodic output signal having a predefined frequency;
a microcontroller using the periodic output signal from the oscillator, the microcontroller selectively providing signal output frequencies to a closely spaced array of input touch terminals of a keypad, the input touch terminals comprising first and second input touch terminals, wherein the selectively providing comprises the microcontroller selectively providing a signal output frequency to each row of the closely spaced array of input touch terminals of the keypad;
the first and second input touch terminals defining areas for an operator to provide an input by proximity and touch; and
a detector circuit coupled to said oscillator for receiving said periodic output signal from said oscillator, and coupled to said first and second touch terminals, said detector circuit being responsive to signals from said oscillator via said microcontroller and a presence of an operator's body capacitance to ground coupled to said first and second touch terminals when proximal or touched by the operator to provide a control output signal for actuation of the controlled keypad device, said detector circuit being configured to generate said control output signal when the operator is proximal or touches said second touch terminal after the operator is proximal or touches said first touch terminal.

106. The capacitive responsive electronic switching circuit as defined in claim 105, wherein each signal output frequency selectively provided to each row of the closely spaced array of input touch terminals of the keypad has a same Hertz value.

107. The capacitive responsive electronic switching circuit as defined in claim 105, wherein each signal output frequency selectively provided to each row of the closely spaced array of input touch terminals of the keypad is selected from a plurality of Hertz values.

108. The capacitive responsive electronic switching circuit as defined in claim 107, wherein the plurality of Hertz values comprises Hertz values greater than 50 kHz.

109. The capacitive responsive electronic switching circuit as defined in claim 107, wherein the plurality of Hertz values comprises Hertz values greater than 100 kHz.

110. The capacitive responsive electronic switching circuit as defined in claim 107, wherein the plurality of Hertz values comprises Hertz values greater than 800 kHz.

111. The capacitive responsive electronic switching circuit as defined in claim 105, wherein the detector circuit is configured to inhibit the control output signal unless the operator is proximal or touches said second touch terminal after the operator is proximal or touches said first touch terminal.

112. The capacitive responsive electronic switching circuit as defined in claim 105, wherein said first and second touch terminals are adapted to be mounted on different surfaces of the controlled keypad device.

113. The capacitive responsive electronic switching circuit as defined in claim 105, wherein said first and second touch terminals are adapted to be mounted on non-parallel planar surfaces of the controlled keypad device.

114. The capacitive responsive electronic switching circuit as defined in claim 105, wherein said first and second touch terminals are adapted to be mounted on perpendicular planar surfaces of the controlled keypad device.

115. The capacitive responsive electronic switching circuit as defined in claim 105 and further including an indicator for indicating when said detector circuit determines that the operator is proximal or touches said first touch terminal.

116. The capacitive responsive electronic switching circuit as defined in claim 105 and further including an indicator for indicating when said detector circuit determines that the operator is proximal or touches said second touch terminal.

117. The capacitive responsive electronic switching circuit as defined in claim 105, wherein the detector circuit comprises a plurality of touch circuits, and wherein the microcontroller selectively provides the signal output frequencies to the closely spaced array of input touch terminals of the keypad via the plurality of touch circuits.

* * * * *